US011800635B2

(12) United States Patent
Kikura et al.

(10) Patent No.: US 11,800,635 B2
(45) Date of Patent: Oct. 24, 2023

(54) INTEGRATED PASSIVE COMPONENT

(71) Applicant: Murata Manufacturing Co., Ltd., Kyoto-fu (JP)

(72) Inventors: Jyou Kikura, Nagaokakyo (JP); Toshihiro Tada, Nagaokakyo (JP); Tadashi Washimori, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 294 days.

(21) Appl. No.: 17/233,200

(22) Filed: Apr. 16, 2021

(65) Prior Publication Data

US 2021/0329773 A1    Oct. 21, 2021

(30) Foreign Application Priority Data

Apr. 20, 2020  (JP) ................. 2020-074811

(51) Int. Cl.
*H01F 27/28* (2006.01)
*H01G 4/008* (2006.01)
(Continued)

(52) U.S. Cl.
CPC ....... *H05K 1/0216* (2013.01); *H01F 27/2804* (2013.01); *H01G 4/008* (2013.01);
(Continued)

(58) Field of Classification Search
CPC .. H01F 17/0013; H01F 27/2804; H01F 27/28; H01F 2017/0026; H01F 2017/004; H01F 27/40; H01F 2027/2809; H01G 4/008; H01G 4/12; H01G 4/33; H01G 4/40; H01G 4/252; H01G 4/012; H01G 4/08; H01G 4/1272; H01G 4/129; H05K 1/0216; H05K 1/0306; H05K 1/0313; H05K 1/036; H05K 1/162; H05K 1/165; H05K 1/02; H05K 1/03; H05K 1/16; H05K 2201/0154; H05K 2201/0195; H05K 2201/068; H05K 2201/0792; H05K 2201/09781; H01L 27/016; H01L 28/40; Y10T 29/49155

(Continued)

(56) References Cited

U.S. PATENT DOCUMENTS

2007/0253144 A1* 11/2007 Kuwajima ............... H01G 4/33
                                                  257/E27.092
2015/0132540 A1*  5/2015 Ide ..................... H01L 21/76251
                                                         428/141
(Continued)

FOREIGN PATENT DOCUMENTS

JP    2000-021635 A   1/2000
JP    2004-319675 A   11/2004
(Continued)

*Primary Examiner* — Timothy J Thompson
*Assistant Examiner* — Guillermo J Egoavil
(74) *Attorney, Agent, or Firm* — Studebaker & Brackett PC

(57) ABSTRACT

A capacitor is disposed on a substrate that is insulative. An inductor is disposed on the substrate. The inductor includes a conductor pattern having at least one end connected to the capacitor. The capacitor includes a dielectric film that mainly contains the same constituent element as a constituent element mainly contained in the substrate and at least two electrodes that face each other with the dielectric film interposed therebetween.

18 Claims, 14 Drawing Sheets

(51) Int. Cl.
  *H01G 4/12* (2006.01)
  *H01G 4/33* (2006.01)
  *H05K 1/02* (2006.01)
  *H05K 1/03* (2006.01)
  *H05K 1/16* (2006.01)

(52) U.S. Cl.
  CPC ............... *H01G 4/12* (2013.01); *H01G 4/33* (2013.01); *H05K 1/0306* (2013.01); *H05K 1/162* (2013.01); *H05K 1/165* (2013.01); *H05K 2201/0195* (2013.01); *H05K 2201/068* (2013.01); *H05K 2201/0792* (2013.01)

(58) Field of Classification Search
  USPC ............... 361/270, 311; 438/381; 333/177; 257/21.008, 27.092, 27.116
  See application file for complete search history.

(56) References Cited

U.S. PATENT DOCUMENTS

2016/0323996 A1* 11/2016 Takemura .......... G01R 31/2889
2017/0230026 A1* 8/2017 Okura .................. H01G 4/40

FOREIGN PATENT DOCUMENTS

JP  2019-186495 A  10/2019
JP  2020-021997 A  2/2020

* cited by examiner

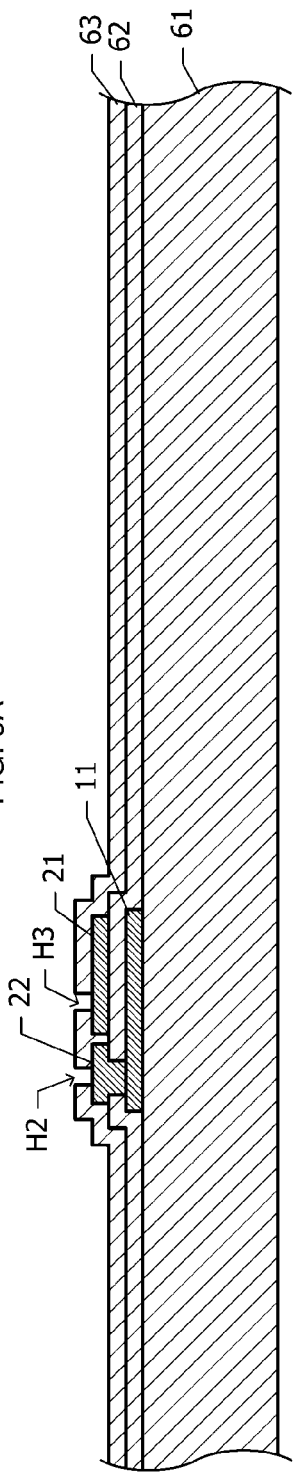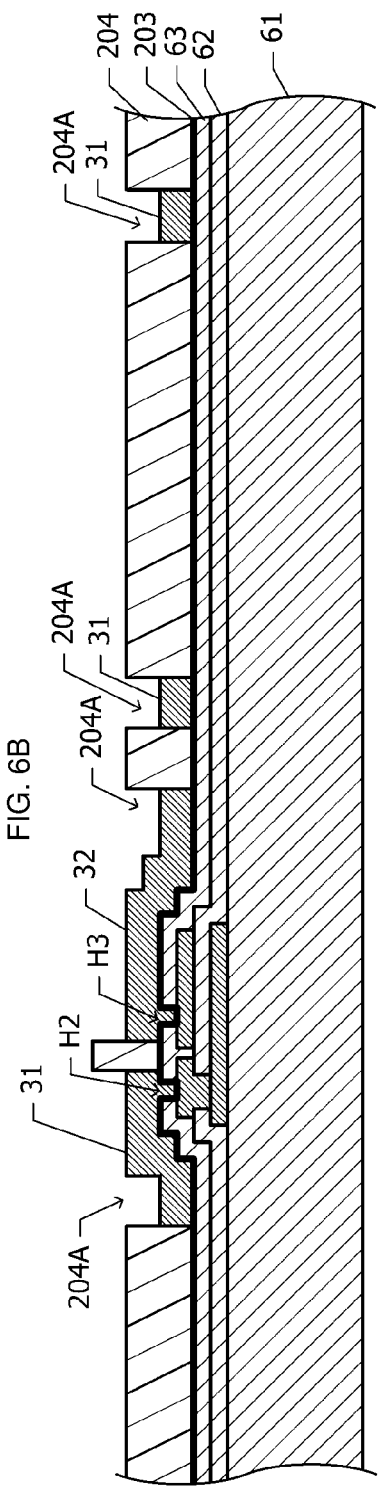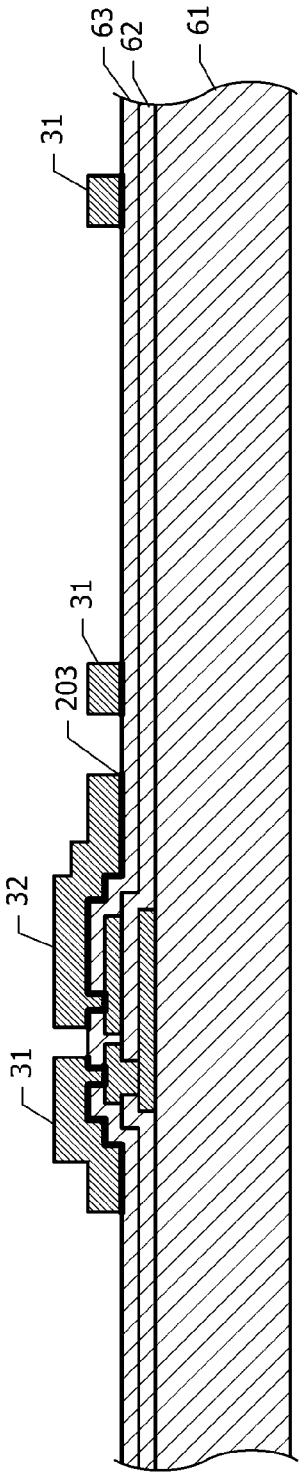

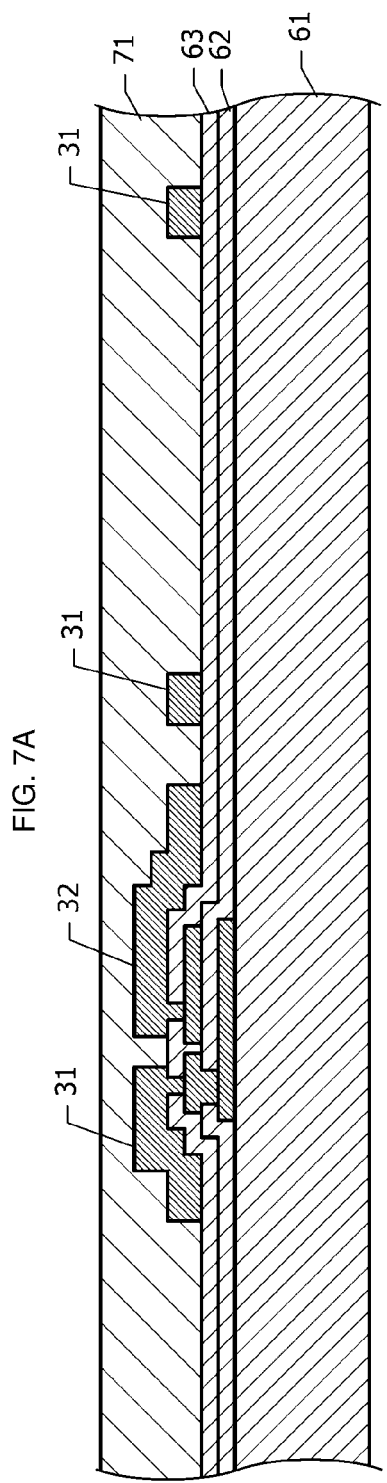
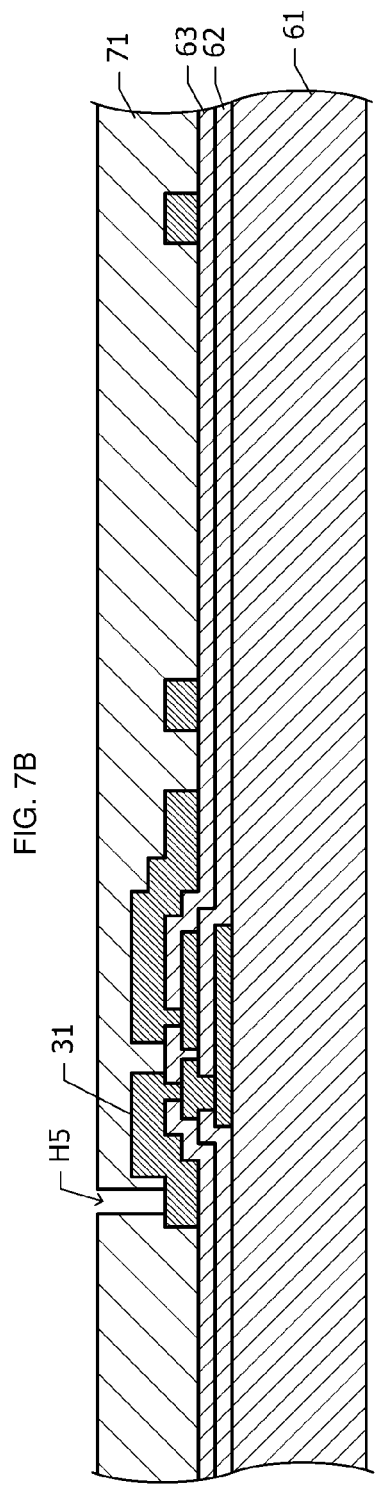

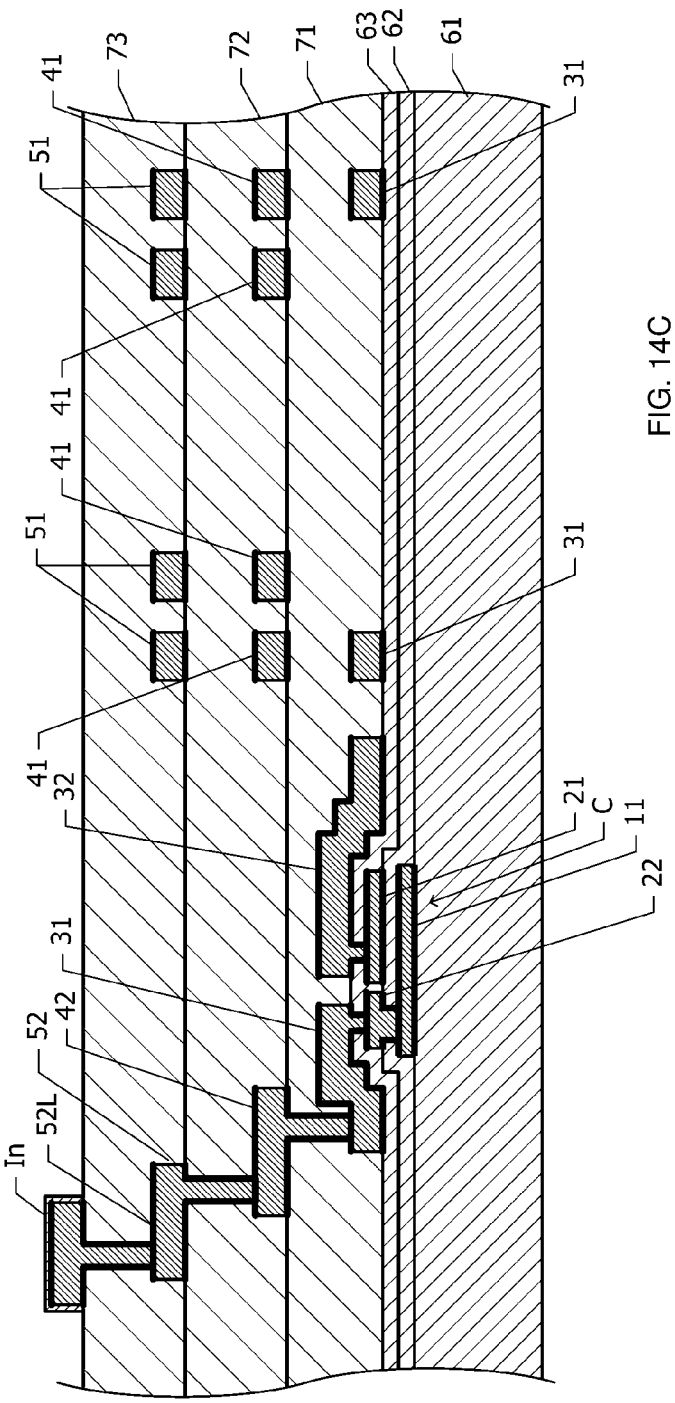
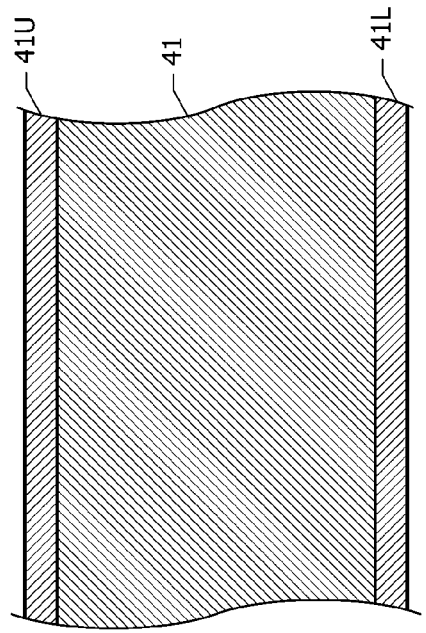
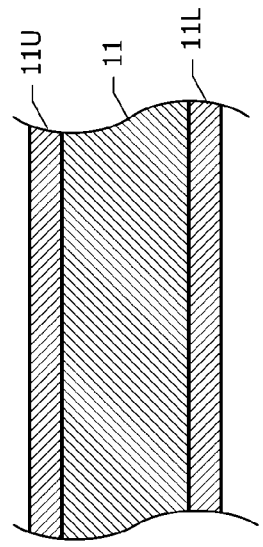

INTEGRATED PASSIVE COMPONENT

CROSS-REFERENCE TO RELATED APPLICATION

This application claims benefit of priority to Japanese Patent Application No. 2020-074811, filed Apr. 20, 2020, the entire content of which is incorporated herein by reference.

BACKGROUND

Technical Field

The present disclosure relates to an integrated passive component in which a plurality of passive elements are integrated.

Background Art

Electronic devices having wireless communication functions have rapidly come into widespread use, and accordingly a very large number of high-frequency bands are used for wireless communication. When a single communication module mounted in an electronic device is configured to support multiple bands and comply with multiple communication standards (multiple modes), the size of the communication module is increased. To reduce the increase in size of the communication module, electronic components mounted in the communication module are desirably smaller, thinner, and highly integrated. A communication module mounted in, for example, a portable terminal desirably includes a smaller and thinner high-frequency front-end module having a higher Q factor.

Three-dimensional packaging technologies and technologies for embedding components in a packaging substrate, for example, are applied to increase the level of integration in the communication module. In addition, thinner and smaller integrated passive components, such as noise filters and band-pass filters, are also desired.

A passive component including a capacitive element formed on a substrate made of an insulating material or a semiconductor material is known, as described, for example, in Japanese Unexamined Patent Application Publication No. 2019-186495. An LC filter including a capacitor and an inductor formed on a conductive substrate is also known, as described, for example, in Japanese Unexamined Patent Application Publication No. 2020-21997.

Thermal stress occurs at and around the capacitor due to the difference in coefficient of linear expansion between the substrate and a dielectric film of the capacitor. When large thermal stress occurs, cracks may be formed in an insulating film in regions around the capacitor. The cracks may cause a reduction in quality, for example, a reduction in moisture resistance.

When the substrate is made of a semiconductor material, a low-resistance layer in which carriers are accumulated may be generated at the interface between the substrate and an insulating film on the substrate. The low-resistance layer causes a reduction in isolation between a plurality of passive elements and circuits formed on the substrate. When the temperature of the substrate increases, the electrical resistance of the low-resistance layer decreases. Therefore, the characteristics of the passive component are further degraded in high-temperature environments.

When the substrate is made of a conductive material, an eddy current is generated in the substrate due to an alternating magnetic field generated by the inductor formed on the substrate. The eddy current causes an increase in loss and reductions in the Q factors of the inductor and a filter circuit.

SUMMARY

Accordingly, the present disclosure provides an integrated passive component in which formation of cracks due to thermal stress does not easily occur and in which degradation of characteristics of a passive circuit can be reduced.

According to preferred embodiments of the present disclosure, an integrated passive component includes a substrate that is insulative; a capacitor disposed on the substrate; and an inductor disposed on the substrate, the inductor including a conductor pattern having at least one end connected to the capacitor. The capacitor includes a dielectric film that mainly contains a same constituent element as a constituent element mainly contained in the substrate, and at least two electrodes that face each other with the dielectric film interposed therebetween.

Since the dielectric film of the capacitor mainly contains the same constituent element as the constituent element mainly contained in the substrate, the difference in coefficient of linear expansion between the substrate and the dielectric film is small. As a result, thermal stress generated in the dielectric film is reduced. Since the thermal stress is reduced, the occurrence of cracks due to the thermal stress is also reduced. Accordingly, the reliability of the passive circuit can be increased.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIGS. 6A, 6B, and 6C are sectional views of the integrated passive component at intermediate manufacturing stages;

FIGS. 7A and 7B are sectional views of the integrated passive component at intermediate manufacturing stages;

FIG. 14A is a sectional view of an integrated passive component according to a fifth embodiment, and FIGS. 14B and 14C are sectional views of a lower electrode and a conductor pattern, respectively.

DETAILED DESCRIPTION

First Embodiment

An integrated passive component according to a first embodiment will now be described with reference to FIGS. 1A to 7B.

Figure 1A:
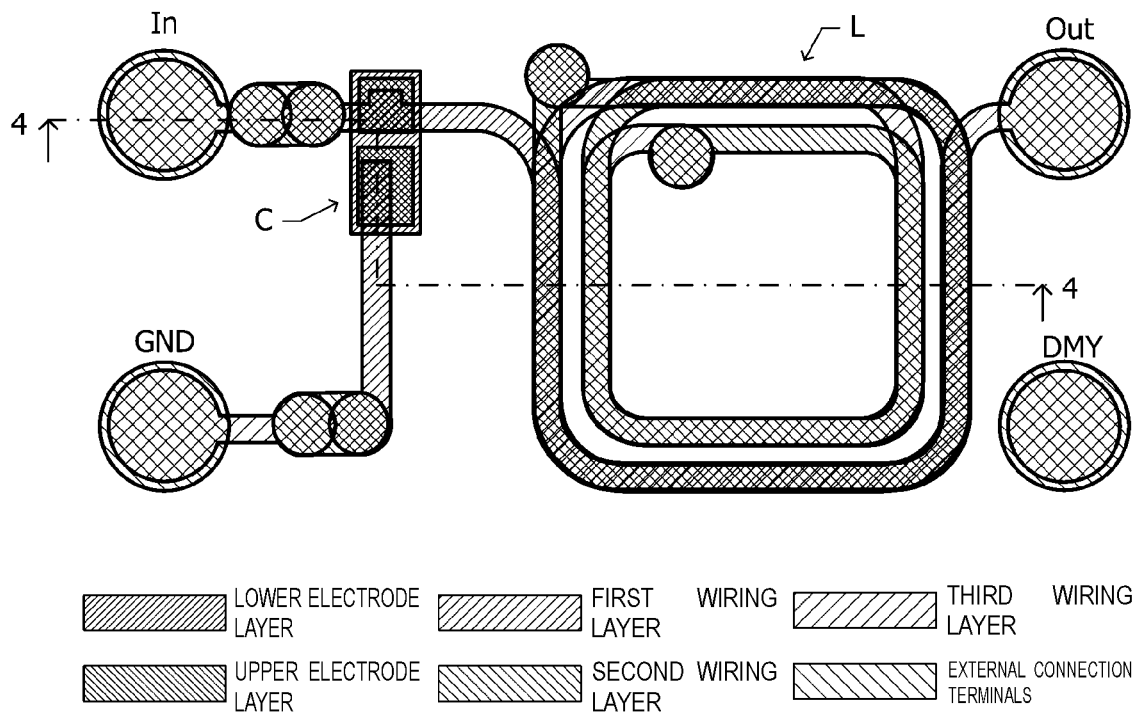
FIG. 1A illustrates the positional relationship between elements of an integrated passive component according to a first embodiment in plan view.
Figure 1B:
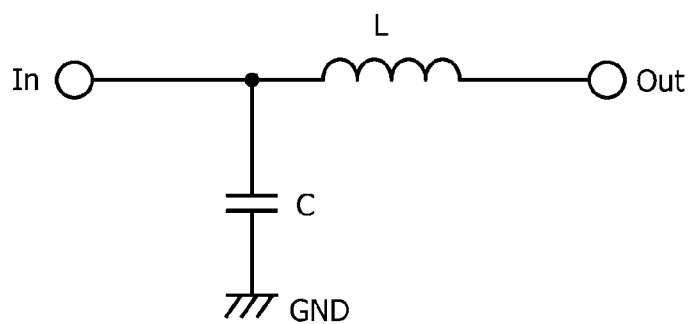
FIG. 1B is an equivalent circuit diagram of the integrated passive component according to the first embodiment.

FIG. 1A illustrates the positional relationship between elements of the integrated passive component according to the first embodiment in plan view, and FIG. 1B is an equivalent circuit diagram of the integrated passive component according to the first embodiment. The integrated passive component according to the first embodiment includes a capacitor C, an inductor L, an input terminal In, an output terminal Out, a ground terminal GND, and a dummy terminal DMY, which are provided on a single insulating substrate.

A plurality of conductor layers and a plurality of insulating films are laminated on the substrate. The insulating films provide insulation between the conductor layers that are adjacent to each other in the vertical direction. In the first embodiment, six conductor layers are laminated together, the conductor layers being referred to as a lower electrode layer, an upper electrode layer, a first wiring layer, a second wiring layer, and a third wiring layer in that order from the substrate. A plurality of external connection terminals including the input terminal In, the output terminal Out, and the ground terminal GND are arranged on the uppermost conductor layer. In FIG. 1A, different conductor layers are hatched in different densities and directions. The shapes of conductor patterns disposed in the conductor layers and the positional relationship between the conductor patterns will be described in detail below with reference to FIGS. 2A to 3B.

As illustrated in FIG. 1B, the inductor L is connected between the input terminal In and the output terminal Out, and the capacitor C is connected between the input terminal In and the ground terminal GND. The integrated passive component according to the first embodiment functions as a low-pass filter.

The structures of conductor patterns in two conductor layers that are adjacent to each other in the vertical direction will now be described with reference to FIGS. 2A to 3B. In FIGS. 2A to 3B, the conductor patterns on the lower one of the conductor layers are shown by dashed lines.

Figure 2A:
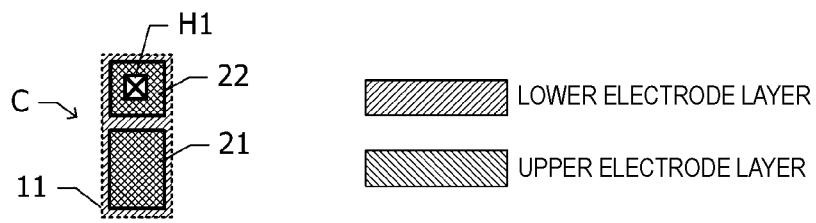
FIG. 2A illustrates the positional relationship between a conductor pattern in a lower electrode layer and conductor patterns in an upper electrode layer in plan view.

FIG. 2A illustrates the positional relationship between a conductor pattern in the lower electrode layer and conductor patterns in the upper electrode layer in plan view. A conductor pattern that constitutes a lower electrode 11 of the capacitor C is disposed in the lower electrode layer. A conductor pattern that constitutes an upper electrode 21 of the capacitor C and another conductor pattern 22 are disposed in the upper electrode layer. The upper electrode 21 and the conductor pattern 22 overlap the lower electrode 11 in plan view. The conductor pattern 22 is connected to the lower electrode 11 through a via hole H1 in an insulating film.

Figure 2B:
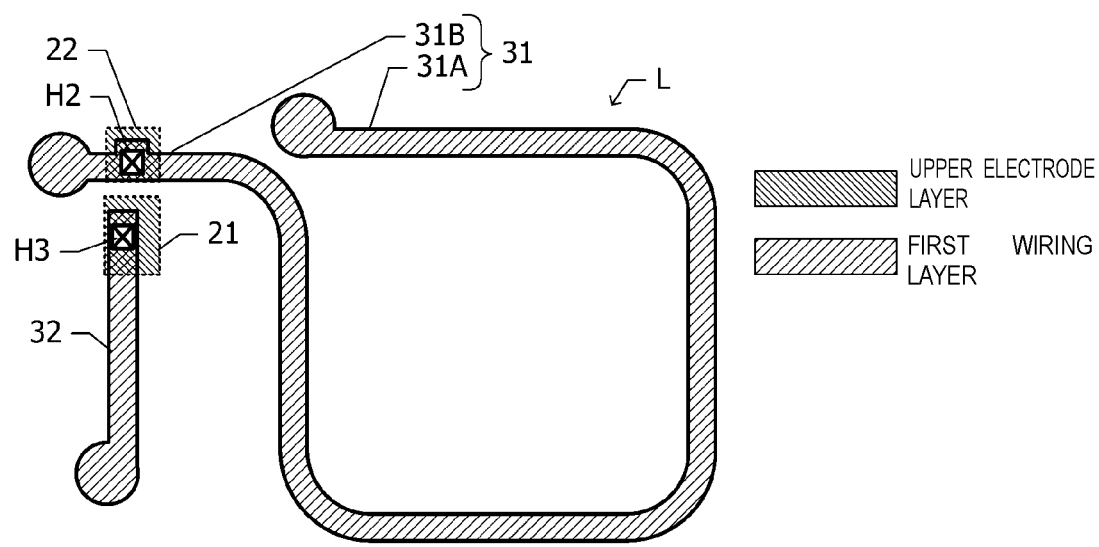
FIG. 2B illustrates the positional relationship between the conductor patterns in the upper electrode layer and conductor patterns in a first wiring layer in plan view.

FIG. 2B illustrates the positional relationship between the conductor patterns in the upper electrode layer and conductor patterns in the first wiring layer in plan view. A conductor pattern 31 and another conductor pattern 32 are disposed in the first wiring layer. The conductor pattern 31 includes a loop portion 31A and an extending portion 31B. The loop portion 31A is located so as not to overlap the capacitor C in plan view, and extends along a square with rounded corners over substantially the entire periphery thereof. The extending portion 31B extends from one end portion of the loop portion 31A and passes through a location where the extending portion 31B overlaps the conductor pattern 22 in the upper electrode layer. The loop portion 31A constitutes a portion of the inductor L. The extending portion 31B is connected to the conductor pattern 22 in the upper electrode layer through a via hole H2. Thus, the conductor pattern 31 is connected to the lower electrode 11 (FIG. 2A) of the capacitor C through the conductor pattern 22.

One end of the conductor pattern 32 overlaps the upper electrode 21 of the capacitor C in plan view. The conductor pattern 32 is connected to the upper electrode 21 through the via hole H3.

Figure 2C:
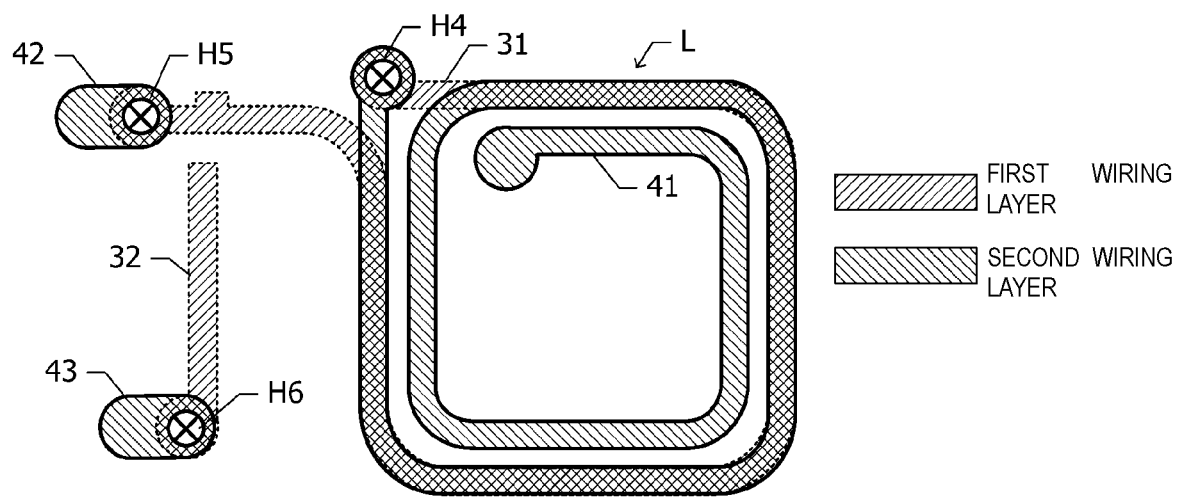
FIG. 2C illustrates the positional relationship between the conductor patterns in the first wiring layer and conductor patterns in a second wiring layer in plan view.

FIG. 2C illustrates the positional relationship between the conductor patterns in the first wiring layer and conductor patterns in the second wiring layer in plan view. A conductor pattern 41, which constitutes a portion of the inductor L, and other conductor patterns 42 and 43 are disposed in the second wiring layer. The conductor pattern 41 includes an outer portion that substantially overlaps the conductor pattern 31 in the first wiring layer and an inner portion that is disposed inside the outer portion and that extends parallel to the outer portion over substantially one turn. Thus, the conductor pattern 41 has a substantially spiral shape whose number of turns is about 2. An outer end portion of the conductor pattern 41 is connected to one end portion of the conductor pattern 31 in the first wiring layer through a via hole H4.

The conductor pattern 42 is connected to the other end portion of the conductor pattern 31 in the first wiring layer through a via hole H5. The conductor pattern 43 is connected to the conductor pattern 32 in the first wiring layer through a via hole H6.

Figure 3A:
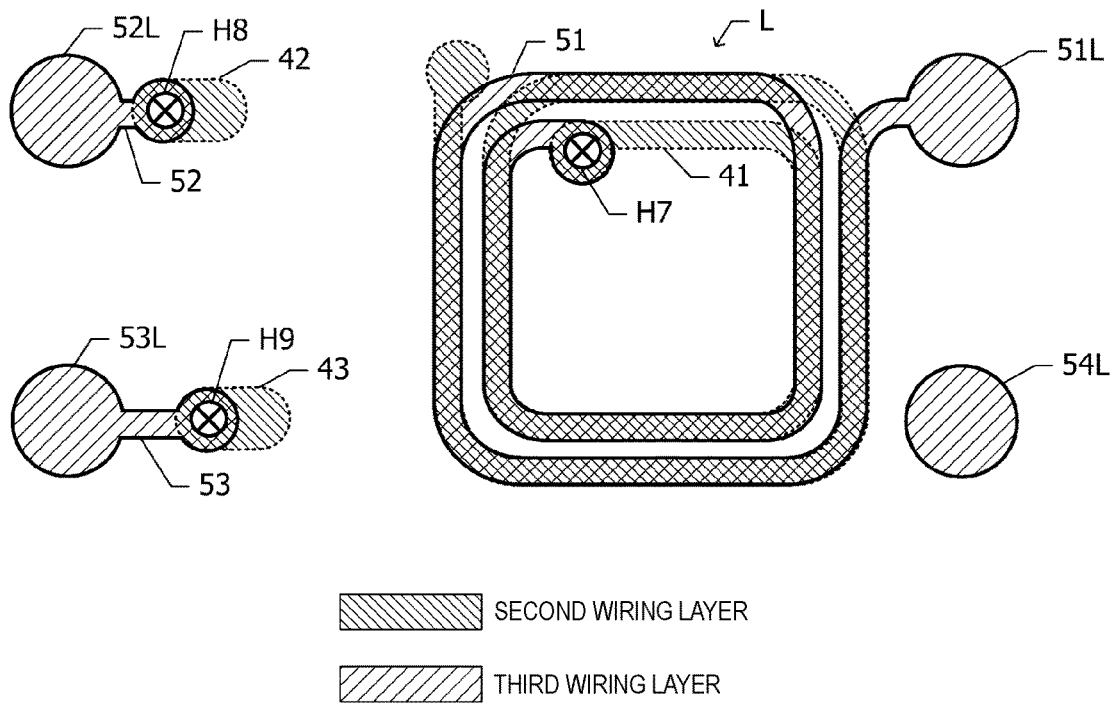
FIG. 3A illustrates the positional relationship between the conductor patterns in the second wiring layer and conductor patterns in a third wiring layer in plan view.

FIG. 3A illustrates the positional relationship between the conductor patterns in the second wiring layer and conductor patterns in the third wiring layer in plan view. A conductor pattern 51, which constitutes a portion of the inductor L, and other conductor patterns 52 and 53 are disposed in the third wiring layer. The conductor pattern 51 has a substantially spiral shape that overlaps the inner and outer portions of the conductor pattern 41 in the second wiring layer. An inner end portion of the conductor pattern 51 is connected to an inner end portion of the conductor pattern 41 in the second wiring layer through a via hole H7. An outer end portion of the conductor pattern 51 is connected to an inner-layer land 51L, which is circular in plan view.

The conductor patterns 52 and 53 are respectively connected to the conductor patterns 42 and 43 in the second wiring layer through via holes H8 and H9. End portions of the conductor patterns 52 and 53 are respectively connected to inner-layer lands 52L and 53L, which are circular in plan view. In addition, an inner-layer land 54L, which is circular in plan view, is disposed so that the inner-layer land 54L is isolated and not connected to any of the conductor patterns in the layers below the third wiring layer.

Figure 3B:
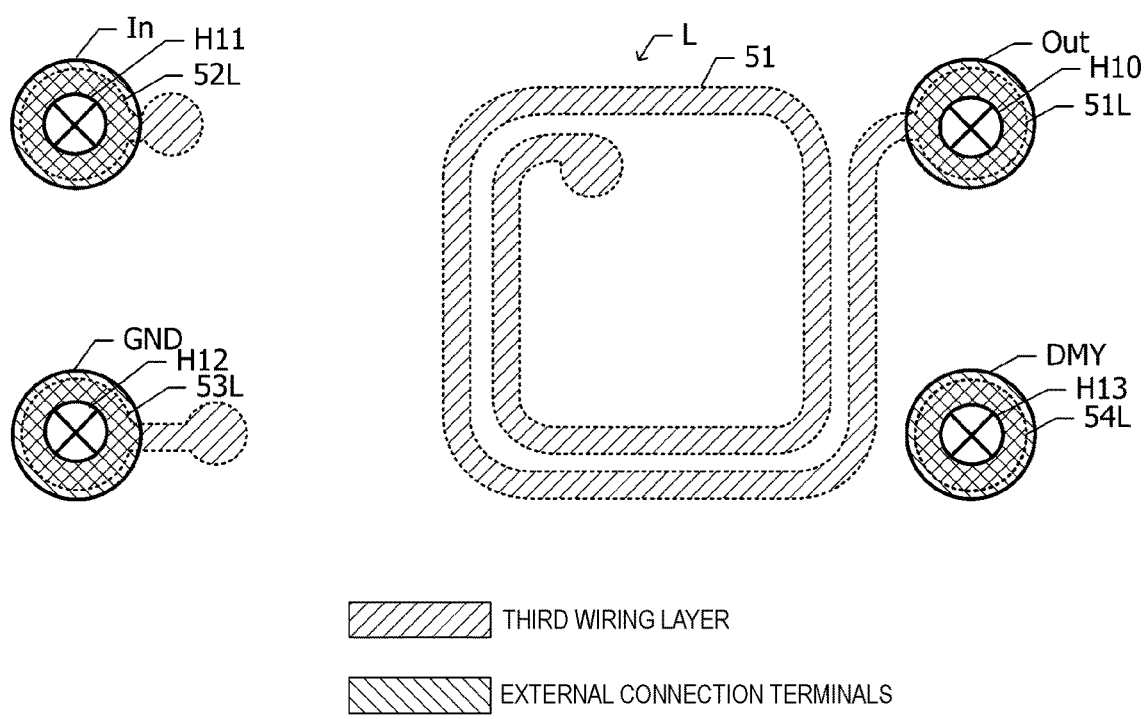
FIG. 3B illustrates the positional relationship between the conductor patterns in the third wiring layer and a plurality of external connection terminals arranged on an uppermost conductor layer in plan view.

FIG. 3B illustrates the positional relationship between the conductor patterns in the third wiring layer and the external connection terminals arranged on the uppermost conductor layer in plan view. The external connection terminals include the input terminal In, the output terminal Out, the ground terminal GND, and the dummy terminal DMY. The output terminal Out is connected to the inner-layer land 51L through a via hole H10. The input terminal In is connected to the inner-layer land 52L through a via hole H11. The ground terminal GND is connected to the inner-layer land 53L through a via hole H12. The dummy terminal DMY is connected to the inner-layer land 54L through a via hole H13.

Thus, the conductor patterns 31, 41, and 51, which constitute portions of the inductor, form the inductor L having a coil axis extending in the thickness direction of the substrate. One end portion of the inductor L is connected to the lower electrode 11 (FIG. 2A) of the capacitor C through the conductor pattern 22 (FIGS. 2A and 2B). The other end portion of the inductor L is connected to the output terminal Out (FIG. 3B) through the inner-layer land 51L (FIG. 3A). The upper electrode 21 (FIG. 2A) of the capacitor C is connected to the ground terminal GND (FIG. 3B) through the conductor patterns 32, 43, and 53 and the inner-layer land 53L (FIGS. 2B, 2C, and 3A). The inductor L (FIG. 1A) and the capacitor C (FIG. 1A) are arranged so as not to overlap in plan view.

Figure 4:
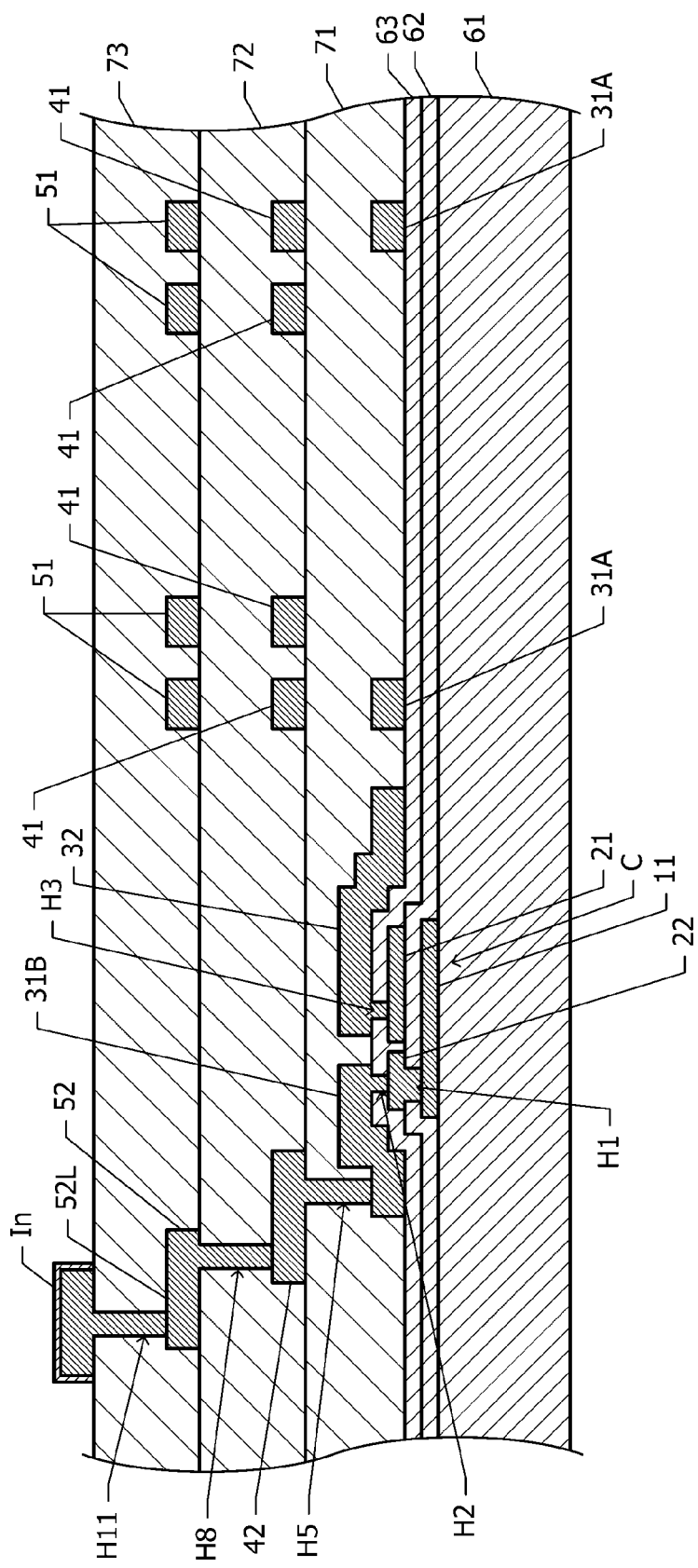
FIG. 4 is a sectional view taken along one-dot chain line 4-4 in FIG. 1A.

FIG. 4 is a sectional view taken along one-dot chain line 4-4 in FIG. 1A.

The lower electrode 11 is disposed on a portion of one surface (hereinafter referred to as an upper surface) of an insulating substrate 61. The upper surface of the substrate 61 and the lower electrode 11 are covered by a dielectric film 62. The upper electrode 21 and the conductor pattern 22 are disposed on the dielectric film 62. The conductor pattern 22 is connected to the lower electrode 11 through the via hole H1 in the dielectric film 62. The lower electrode 11 and the upper electrode 21, which have the dielectric film 62 interposed therebetween, form the capacitor C.

The upper electrode 21, the conductor pattern 22, and the dielectric film 62 are covered by a first insulating film 63. In other words, the first insulating film 63 covers the capacitor C. The loop portion 31A and the extending portion 31B of the conductor pattern 31 and the conductor pattern 32 are disposed on the first insulating film 63. In the cross section illustrated in FIG. 4, the conductor pattern 31, which constitutes a portion of the inductor L, is visible at three locations. The conductor pattern 31 is connected to the conductor pattern 22 through the via hole H2 in the first insulating film 63. The conductor pattern 32 is connected to the upper electrode 21 through the via hole H3 in the first insulating film 63.

The conductor patterns 31 and 32 and the first insulating film 63 are covered by a second insulating film 71 of a first layer. The conductor pattern 41, which constitutes a portion of the inductor L, and the conductor pattern 42 are disposed on the second insulating film 71 of the first layer. In the cross section illustrated in FIG. 4, the conductor pattern 41 is visible at four locations. Among the four portions of the conductor pattern 41 that are visible, the portions of the conductor pattern 41 at both ends are located to overlap the conductor pattern 31 in the layer therebelow in plan view. The conductor pattern 42 is connected to the conductor pattern 31 in the layer therebelow through the via hole H5 in the second insulating film 71.

The conductor patterns 41 and 42 in the second wiring layer and the second insulating film 71 of the first layer are covered by a second insulating film 72 of a second layer. The conductor pattern 51, which constitutes a portion of the inductor L, the conductor pattern 52, and the inner-layer land 52L are disposed on the second insulating film 72 of the second layer. In the cross section illustrated in FIG. 4, the conductor pattern 51 is visible at four locations. The four portions of the conductor pattern 51 that are visible in the cross section are located to overlap the conductor pattern 41 in the layer therebelow in plan view. The conductor pattern 52 is connected to the conductor pattern 42 in the layer therebelow through the via hole H8 in the second insulating film 72. Thus, the inductor L includes the conductor patterns 31, 41, and 51 disposed above and below at least one of the second insulating films 71, 72, and 73. The inductor L has a substantially spiral structure having a central axis extending in a direction perpendicular to the upper surface of the substrate 61, and also has a substantially helical structure.

The conductor patterns 51 and 52 and the second insulating film 72 of the second layer are covered by a second insulating film 73 of a third layer. The input terminal In is disposed on the second insulating film 73 of the third layer. The input terminal In is connected to the inner-layer land 52L in the layer therebelow through the via hole H11 in the second insulating film 73.

Examples of materials and dimensions of the elements of the integrated passive component will now be described.

The substrate 61, the dielectric film 62, and the first insulating film 63 are made of insulating materials mainly containing the same constituent element. For example, the substrate 61, the dielectric film 62, and the first insulating film 63 are made of insulating materials mainly containing silicon and nitrogen as constituent elements thereof. For example, the substrate 61 is made of a silicon nitride (SiN) ceramic, and the dielectric film 62 and the first insulating film 63 are made of amorphous silicon nitride.

The expression "mainly contain" means that the material may additionally contain other elements as long as the coefficient of linear expansion and the volume resistivity thereof are not largely affected. Silicon nitride has a coefficient of linear expansion of about $2.5 \times 10^{-6}/°$ C. and a volume resistivity of greater than about $10^{14}$ Ω·cm. When, for example, a content of a constituent element in a material is greater than or equal to 50 mol %, the material can be regarded as mainly containing the constituent element. For example, when the material is silicon oxynitride (SiON), which is silicon nitride containing oxygen, or silicon carbonitride (SiCN), which is silicon nitride containing carbon, and when the content of oxygen or nitrogen therein is less than 50 mol %, the material can be regarded as mainly containing silicon and nitrogen.

The second insulating films 71, 72, and 73 are made of a resin, such as an epoxy resin or a polyimide resin. The insulating material of the second insulating films 71, 72, and 73 has a Young's modulus less than those of the insulating materials of the substrate 61, the dielectric film 62, and the first insulating film 63. For example, the insulating material of the second insulating films 71, 72, and 73 has a Young's modulus of less than or equal to about 10 GPa. The Young's modulus of an epoxy film, for example, is in the range of greater than or equal to about 2 GPa and less than or equal to about 8 GPa. The second insulating films 71, 72, and 73 may be made of a composite material composed of a resin containing an inorganic insulating material so that the coefficient of linear expansion of the second insulating films 71, 72, and 73 is close to the coefficient of linear expansion of the substrate 61.

The lower electrode 11 and the upper electrode 21 of the capacitor C and the conductor pattern 22 may be made of a highly conductive metal material, such as Au, Al, or Cu. The conductor patterns 31, 41, and 51 that form the inductor L and the conductor patterns 32, 42, 43, 52, and 53 disposed on the same wiring layers as the conductor patterns 31, 41, and 51 are made of Au, Al, Cu, or a metal material containing Cu as the main component. Preferably, Cu or a metal material containing Cu as the main component is used so that the thicknesses can be easily increased.

The input terminal In, the output terminal Out, the ground terminal GND, and the dummy terminal DMY each include a main portion made of Au, Al, Cu, or a material containing Cu as the main component and an anti-oxidation film that covers the surface of the main portion. The anti-oxidation film is made of, for example, NiAu or NiPaAu. A solder layer made of, for example, NiSn or NiSnAg may be additionally formed on the external connection terminals.

The thickness of the substrate 61 is adjusted in accordance with the requirement specifications regarding the height of the integrated passive component. The thickness of the substrate 61 is, for example, greater than or equal to about 50 μm and less than or equal to about 300 μm (i.e., from about 50 μm to about 300 μm). The thickness of the dielectric film 62 is determined based on the capacitance, voltage endurance characteristics, moisture resistance, etc. required of the capacitor C. The thickness of the dielectric film 62 is, for example, greater than or equal to about 30 nm and less than or equal to about 500 nm (i.e., from about 30 nm to about 500 nm). The thickness of the first insulating film 63 is mainly determined based on the moisture resistance required of the capacitor C. The thickness of the first insulating film 63 is, for example, greater than or equal to about 100 nm and less than or equal to about 1000 nm (i.e., from about 100 nm to about 1000 nm).

The thickness of the lower electrode 11 is preferably less than or equal to the thickness of the dielectric film 62 so that the dielectric film 62 has a sufficient coverage ratio. The thickness of the upper electrode 21 and the conductor pattern 22 is preferably less than or equal to the thickness of the first insulating film 63 so that the first insulating film 63 has a sufficient coverage ratio.

To maintain the Q factor of the inductor L at a high level, the resistances of the conductor patterns 31, 41, and 51 that form the inductor L are preferably reduced. To reduce the resistances of the conductor patterns 31, 41, and 51, the conductor patterns 31, 41, and 51 are preferably as thick as possible. For example, the thickness of the conductor patterns 31, 41, and 51 is preferably greater than or equal to five times the thickness of the lower electrode 11 and the upper electrode 21 of the capacitor C. For example, preferably, the thickness of the conductor patterns 31, 41, and 51 is about 5 μm, and the thickness of the lower electrode 11 and the upper electrode 21 is less than or equal to about 1 μm.

A method for manufacturing the integrated passive component according to the first embodiment will now be described with reference to FIGS. 5A to 7B. FIGS. 5A to 7B are sectional views of the integrated passive component at intermediate manufacturing stages.

Figure 5A:
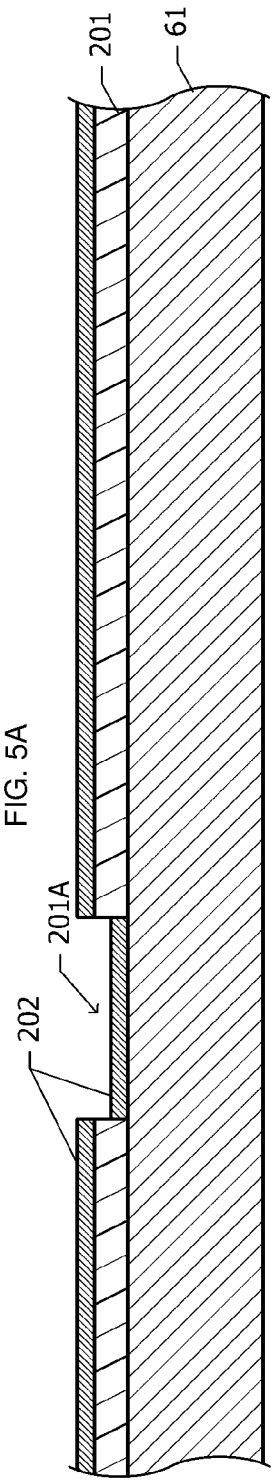
FIGS. 5A, 5B, 5C, and 5D are sectional views of the integrated passive component at intermediate manufacturing stages.
Figure 5B:
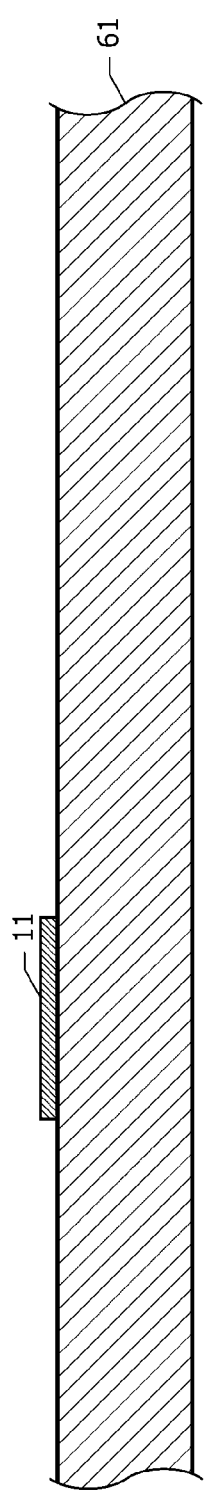

As illustrated in FIG. 5A, a photoresist film 201 is formed on the upper surface of the substrate 61, and a cavity 201A is formed in a region where the lower electrode 11 is to be formed. A conductor film 202, which is used to form the lower electrode 11, is formed on the upper surface of the substrate 61 exposed at the bottom of the cavity 201A and the photoresist film 201 by vacuum deposition. The conductor film 202 has a two-layer structure including, for example, a Ti film having a thickness of about 50 nm and an Au film having a thickness of about 100 nm. The photoresist film 201 is removed together with the conductor film 202 formed thereon. Thus, as illustrated in FIG. 5B, the lower electrode 11 remains on the substrate 61.

Figure 5C:
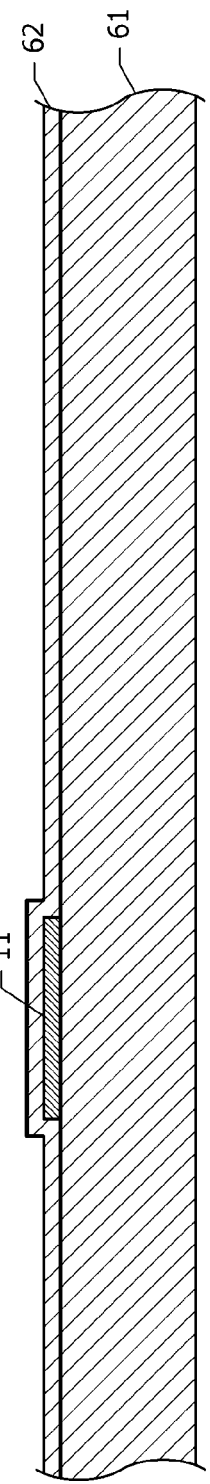
Figure 5D:
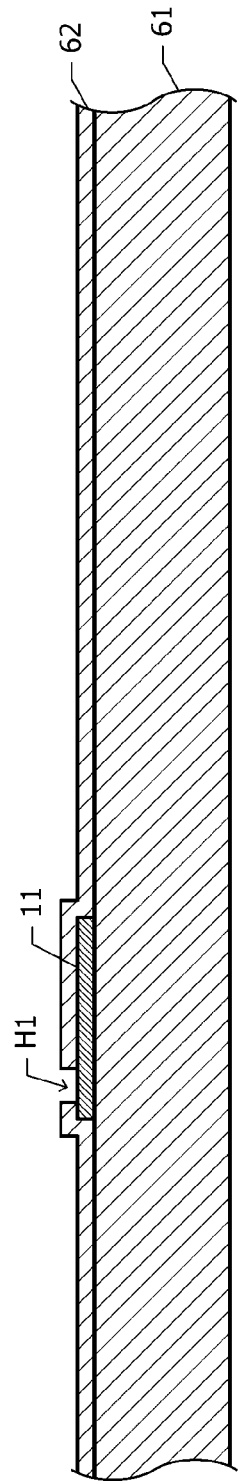

As illustrated in FIG. 5C, the dielectric film 62 is formed to cover the upper surfaces of the substrate 61 and the lower electrode 11 by plasma CVD. After that, as illustrated in FIG. 5D, the via hole H1 is formed in the dielectric film 62 by reactive ion etching (RIE). A portion of the lower electrode 11 is exposed at the hole H1.

Next, as illustrated in FIG. 6A, the upper electrode 21 and the conductor pattern 22 are formed on the dielectric film 62 by a process similar to that for forming the lower electrode 11. After that, the first insulating film 63 is formed to cover the upper electrode 21, the conductor pattern 22, and the dielectric film 62 by plasma CVD. In addition, the via holes H2 and H3 are formed in the first insulating film 63 by reactive ion etching.

As illustrated in FIG. 6B, a multilayer metal film 203 is formed to cover the upper surface of the first insulating film 63 and the side and bottom surfaces of the via holes H2 and H3 by sputtering. The multilayer metal film 203 has a two-layer structure including a Ti film and a Cu film provided on the Ti film. A photoresist film 204 is formed on the multilayer metal film 203, and cavities 204A are formed in regions where conductor patterns are to be formed. The cavities 204A are filled with Cu by electroplating using the multilayer metal film 203 as a seed layer. Thus, the conductor patterns 31 and 32 are formed in the cavities 204A.

After that, the photoresist film 204 is removed by using an organic solvent, and the multilayer metal film 203 is removed by wet etching. As a result, as illustrated in FIG. 6C, the conductor patterns 31 and 32 are formed. The multilayer metal film 203 used as a seed layer for electroplating remains under the conductor patterns 31 and 32. The multilayer metal film 203 is not illustrated in FIG. 7A and the following figures or in FIG. 4

Next, as illustrated in FIG. 7A, the second insulating film 71 of the first layer is formed to cover the conductor patterns 31 and 32 and the first insulating film 63. The second insulating film 71 is formed by laminating an epoxy resin film in a semi-cured state (B-stage), in which a photosensitive material is mixed, by a vacuum lamination method. The second insulating film 71 has a ground surface with steps corresponding to the conductor patterns 31 and 32. An upper surface of the second insulating film 71 is substantially flat.

As illustrated in FIG. 7B, the second insulating film 71 is partially exposed to light and developed by using an alkaline solution to form the via hole H5. A portion of the conductor pattern 31 is exposed at the via hole H5. After that, the epoxy resin film in the semi-cured state is cured by a heat treatment.

The processes described above with reference to FIGS. 6B to 7B are repeated to form the multilayer structure from the conductor patterns 41 and 42 to the second insulating film 73 of the third layer illustrated in FIG. 4. Then, the external connection terminals including the input terminal In are formed, and an anti-oxidation film made of NiAu is formed on the surfaces of the external connection terminals by electroless plating. After that, the lower surface of the substrate 61 is back-ground so that the thickness of the substrate 61 is reduced to a desired thickness. After the grinding process, the substrate 61 is divided into pieces by a dicing process. Thus, the integrated passive component is obtained.

Advantageous effects of the first embodiment will now be described.

In the first embodiment, the dielectric film 62 (FIG. 4) is made of an insulating material that mainly contains the same constituent element as the constituent element mainly contained in the substrate 61 (FIG. 4). Therefore, the difference in coefficient of linear expansion between the dielectric film 62 and the substrate 61 is small, so that thermal strain and residual thermal stress that may be generated during manufacturing processes are reduced. As a result, formation of cracks due to thermal stress does not easily occur in the insulating material around the capacitor C (FIG. 4). Accordingly, reduction in the moisture resistance due to cracks can be suppressed, and the quality of the integrated passive component can be increased.

In addition, in the first embodiment, the first insulating film 63 (FIG. 4) that covers the capacitor C is also made of an insulating material that mainly contains the same constituent element as the constituent element mainly contained in the substrate 61. Therefore, formation of cracks in the insulating material around the capacitor C due to thermal stress can be further reduced.

Since the substrate 61 is made of an insulating material, reduction in isolation between the passive elements integrated in the integrated passive component can be suppressed. In addition, even when an alternating magnetic field is generated due to a high-frequency current that flows through the inductor L, no eddy current is generated in the substrate 61. In addition, the inductor L is located so as not to overlap the capacitor C in plan view. Therefore, even when an alternating magnetic field is generated, the eddy current is not easily generated in the lower electrode 11 or the upper electrode 21 of the capacitor C. Since no reduction in the Q factor of the inductor L due to the eddy current occurs, the Q factor of the inductor L can be increased.

In addition, in the first embodiment, the second insulating films 71, 72, and 73 (FIG. 4) are made of a material having a Young's modulus less than that of the conductor patterns 31, 41, and 51. Therefore, when the temperature of the integrated passive component is increased and when the second insulating films 71, 72, and 73 and the conductor patterns 31, 41, and 51 thermally expand, the second insulating films 71, 72, and 73 absorb the thermal strain. Thus, the thermal strain that occurs in the conductor patterns 31, 41, and 51 can be reduced.

In general, when the thickness of the conductor patterns 31, 41, and 51 is increased, thermal strain more easily occurs in the conductor patterns 31, 41, and 51 and in the insulating films around the conductor patterns 31, 41, and 51. In the first embodiment, since the second insulating films 71, 72, and 73 absorb the thermal strain, various problems due to the thermal strain do not easily occur even when the thickness of the conductor patterns 31, 41, and 51 is increased. By increasing the thickness of the conductor patterns 31, 41, and 51 that form the inductor L, the resistance component of the inductor L can be reduced to achieve a high Q factor.

Since the second insulating films 71, 72, and 73 are made of a resin, even though the second insulating films 71, 72, and 73 each have a ground surface having irregularities, the second insulating films 71, 72, and 73 may be formed such that the upper surfaces thereof are flat. In other words, each of the second insulating films 71, 72, and 73 may be formed such that deviation from flatness of the upper surface is less than that of the lower surface. The term "deviation from flatness" means the amount of deviation from a surface that is geometrically completely flat. For example, the deviation from flatness of a surface may be defined as a distance between two parallel planes between which the surface is sandwiched. Since the second insulating films 71, 72, and 73 have flat upper surfaces, the conductor patterns 41 and 51, the input terminal In, etc. can be finely formed on the second insulating films 71, 72, and 73 in shapes with high aspect ratios in cross section.

Since thermal strain does not easily occur in the conductor patterns 31, 41, and 51 that form the inductor L and the second insulating films 71, 72, and 73 can be formed to have flat upper surfaces, the number of layers having the conductor patterns that form the inductor L can be increased. When the number of layers of the inductor L is increased, a desired inductance can be obtained by using only a substantially helical structure without using a substantially spiral structure. When only the substantially helical structure is used, the dimension of the inductor L in plan view can be reduced. As a result, the size of the integrated passive component can be reduced.

A modification of the first embodiment will now be described.

Although the first insulating film 63 is made of an insulating material that mainly contains the same constituent element as the constituent element mainly contained in the substrate 61 in the first embodiment, the first insulating film 63 may instead be formed of another insulating material. The first insulating film 63 is preferably made of an inorganic insulating material to ensure sufficient moisture resistance of the capacitor C. For example, the first insulating film 63 may be made of SiO. To reduce the occurrence of cracks, the material of the first insulating film 63 is preferably selected so that the difference in coefficient of linear expansion between the first insulating film 63 and the substrate 61 is less than the difference in coefficient of linear expansion between the substrate 61 and the second insulating films 71, 72, and 73.

In the first embodiment, the substrate 61 and the dielectric film 62 contain silicon nitride. However, the substrate 61 and the dielectric film 62 may instead contain other inorganic insulating materials, such as aluminum oxide.

In the first embodiment, the conductor patterns 31 and 32 in the first wiring layer are disposed directly on the first insulating film 63 (FIG. 4). However, the conductor patterns 31 and 32 in the first wiring layer may instead be disposed on an insulating film made of a resin that is disposed on the first insulating film 63. In such a case, the first wiring layer may be formed to have a flat ground surface.

An inorganic insulating film may be disposed to cover the conductor patterns 31 and 32 in the first wiring layer and the first insulating film 63 (FIG. 4), and the second insulating film 71 of the first layer may be disposed on the inorganic insulating film. The inorganic insulating film may be made of the same material as that of the first insulating film 63. When the inorganic insulating film is disposed on the first wiring layer, moisture does not easily reach the capacitor C, so that the environmental resistance of the capacitor C can be increased.

In the first embodiment, one end of the inductor L is connected to one electrode of the capacitor C. Alternatively, however, both ends of the inductor L may be connected to respective ones of the two electrodes of the capacitor C. In such a case, an LC parallel resonant circuit can be obtained.

Second Embodiment

An integrated passive component according to a second embodiment will now be described with reference to FIGS. 8A to 11. Description of structures that are the same as those of the integrated passive component according to the first embodiment illustrated in FIGS. 1A to 7 will be omitted.

Figure 8A:
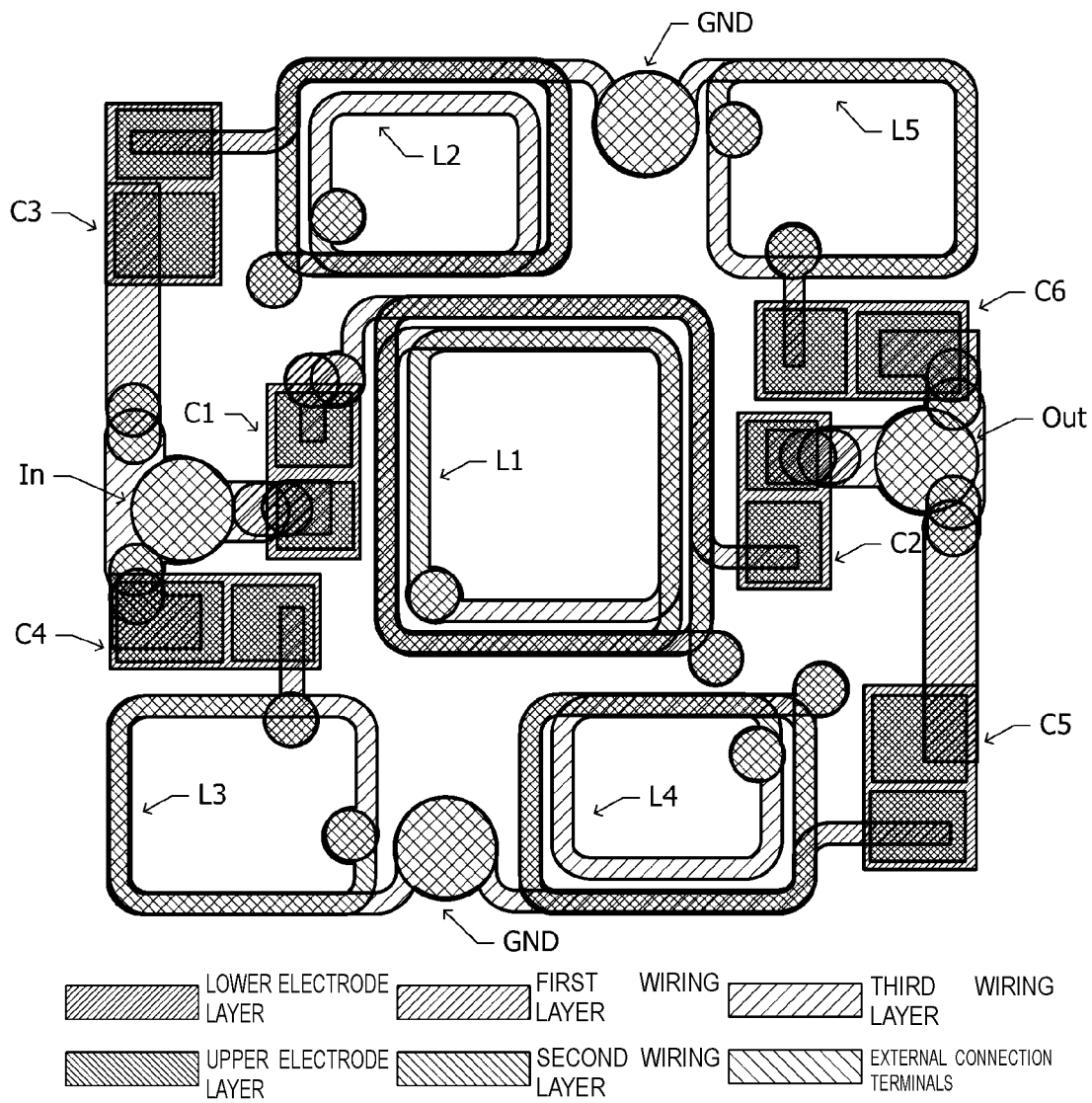
FIG. 8A illustrates the positional relationship between elements of an integrated passive component according to a second embodiment in plan view.
Figure 8B:
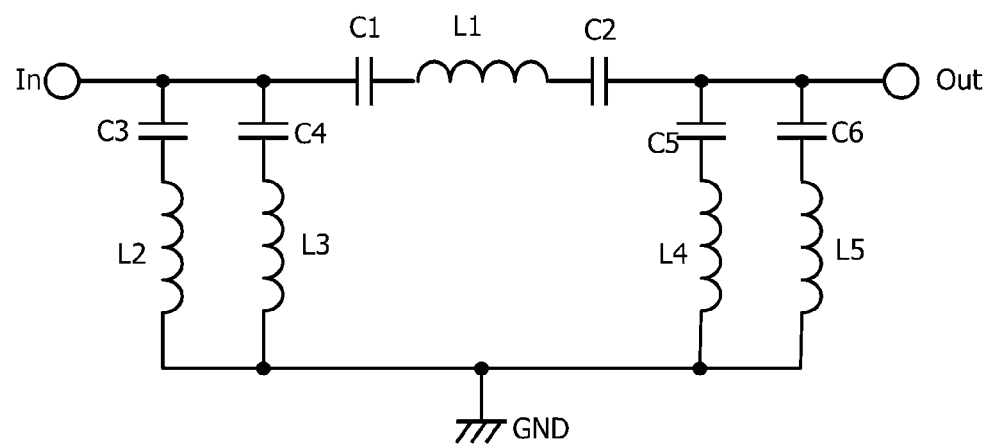
FIG. 8B is an equivalent circuit diagram of the integrated passive component according to the second embodiment.

FIG. 8A illustrates the positional relationship between elements of the integrated passive component according to the second embodiment in plan view, and FIG. 8B is an equivalent circuit diagram of the integrated passive component according to the second embodiment. The integrated passive component according to the first embodiment is a low-pass filter including a single capacitor C and a single inductor L. The integrated passive component according to the second embodiment is a band-pass filter including six capacitors and five inductors.

A capacitor C1, an inductor L1, and a capacitor C2 are connected in series between an input terminal In and an output terminal Out in that order from the input terminal In. A series circuit including a capacitor C3 and an inductor L2 and a series circuit including a capacitor C4 and an inductor L3 are connected in parallel between the input terminal In and a ground terminal GND. A series circuit including a capacitor C5 and an inductor L4 and a series circuit including a capacitor C6 and an inductor L5 are connected in parallel between the output terminal Out and the ground terminal GND.

Similar to the first embodiment, the above-mentioned passive elements are formed of conductor patterns included in a lower electrode layer, an upper electrode layer, a first wiring layer, a second wiring layer, and a third wiring layer. The input terminal In, the output terminal Out, and two ground terminals GND are provided as external connection terminals.

The structures of conductor patterns in two conductor layers that are adjacent to each other in the vertical direction will now be described with reference to FIGS. 9A to 11. In FIGS. 9A to 11, the conductor patterns on the lower one of the conductor layers are shown by dashed lines.

Figure 9A:
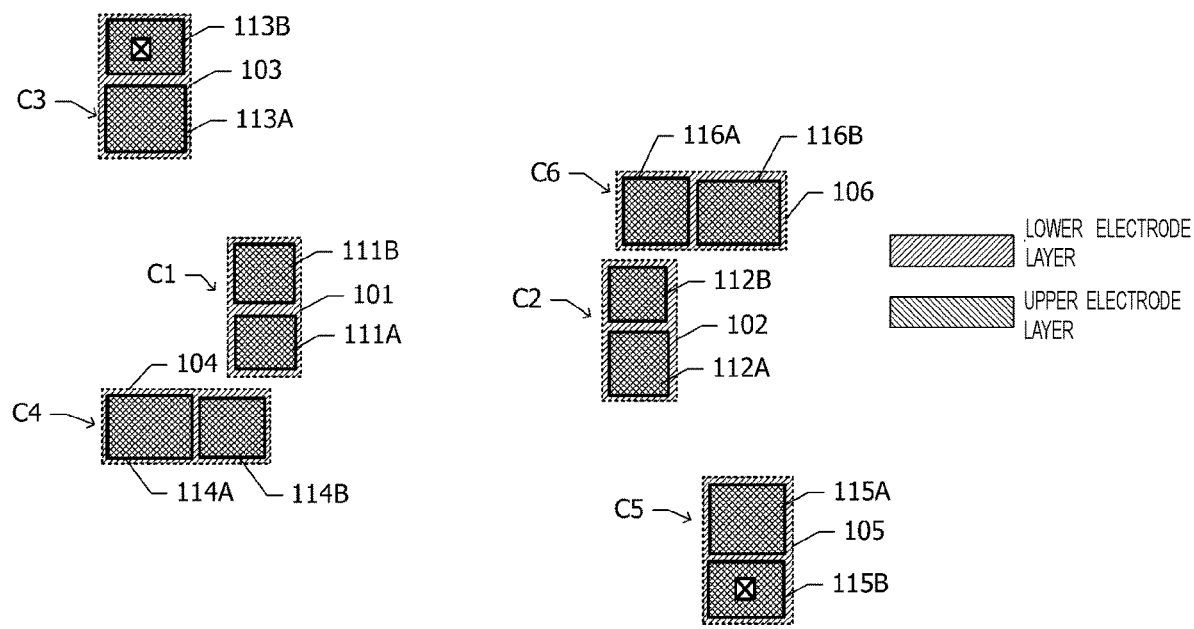
FIG. 9A illustrates the positional relationship between conductor patterns in a lower electrode layer and conductor patterns in an upper electrode layer in plan view.
Figure 9B:
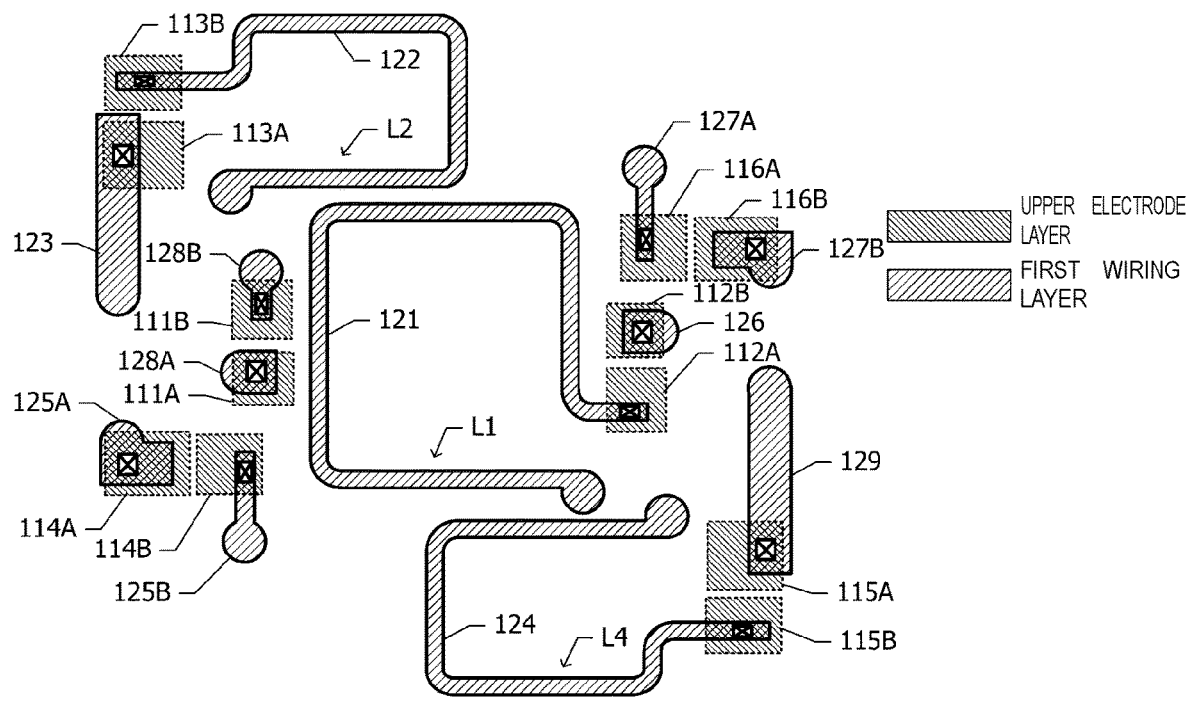
FIG. 9B illustrates the positional relationship between the conductor patterns in the upper electrode layer and conductor patterns in a first wiring layer in plan view.
Figure 10A:
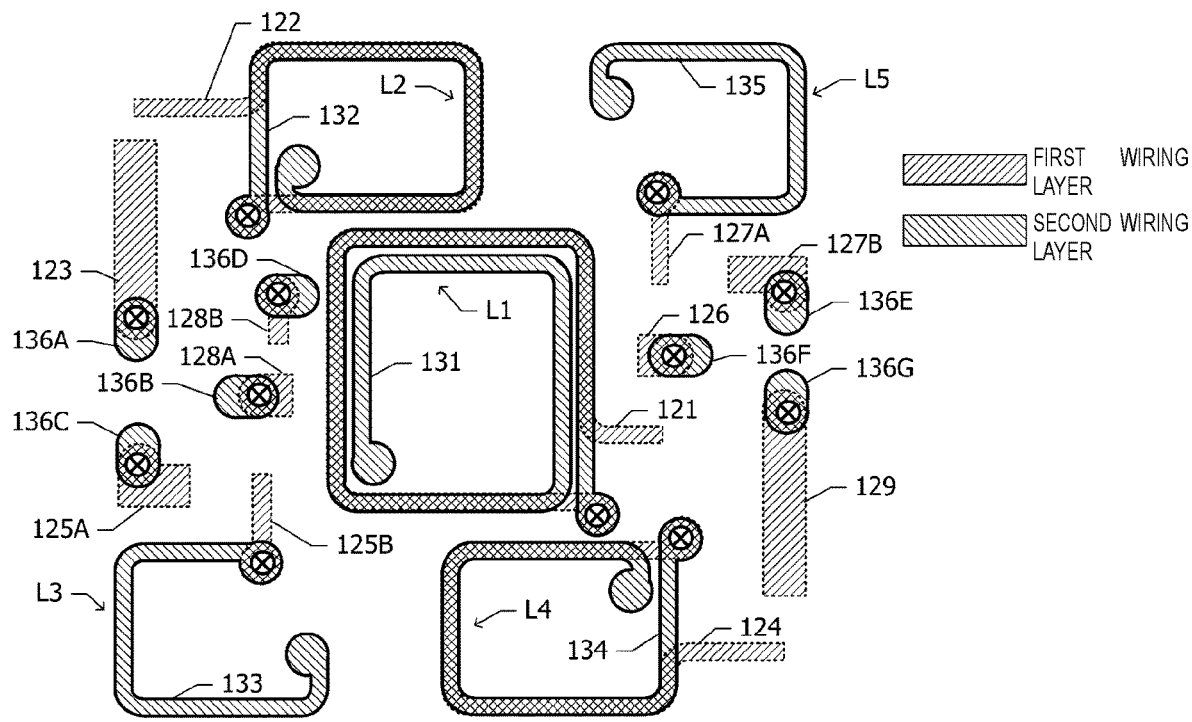
FIG. 10A illustrates the positional relationship between the conductor patterns in the first wiring layer and conductor patterns in a second wiring layer in plan view.
Figure 10B:
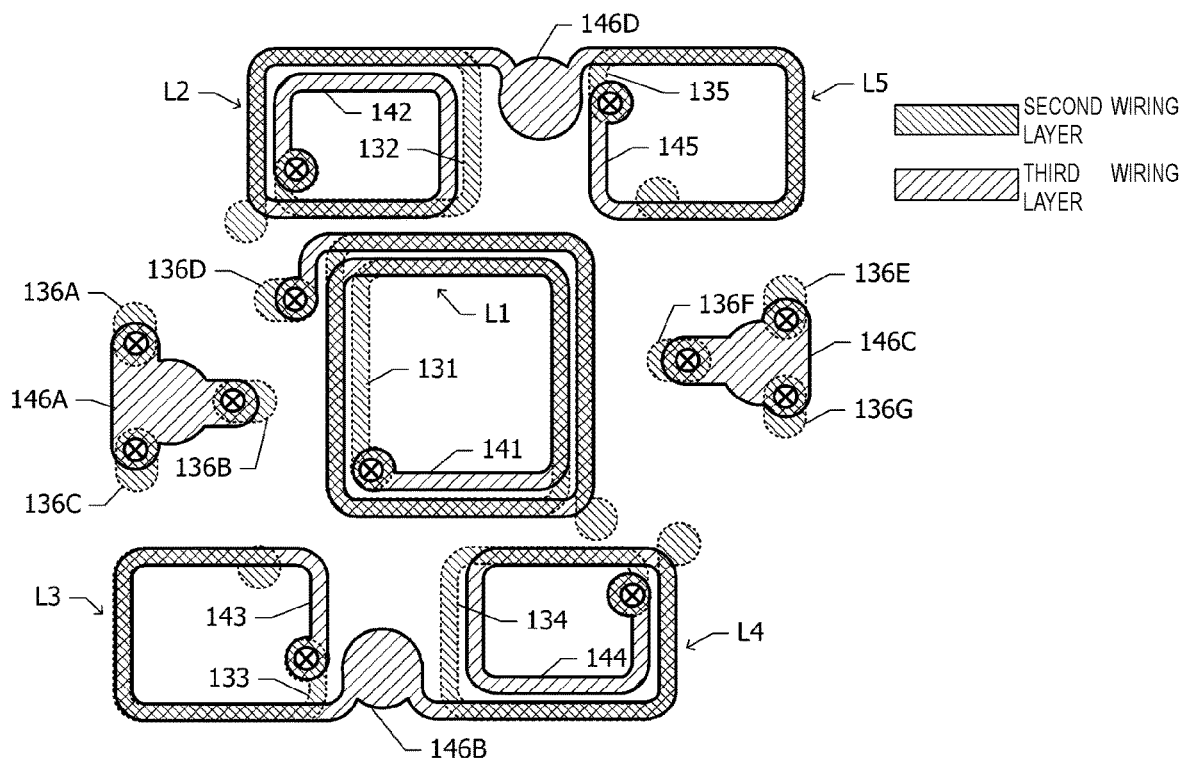
FIG. 10B illustrates the positional relationship between the conductor patterns in the second wiring layer and conductor patterns in a third wiring layer in plan view.
Figure 11:
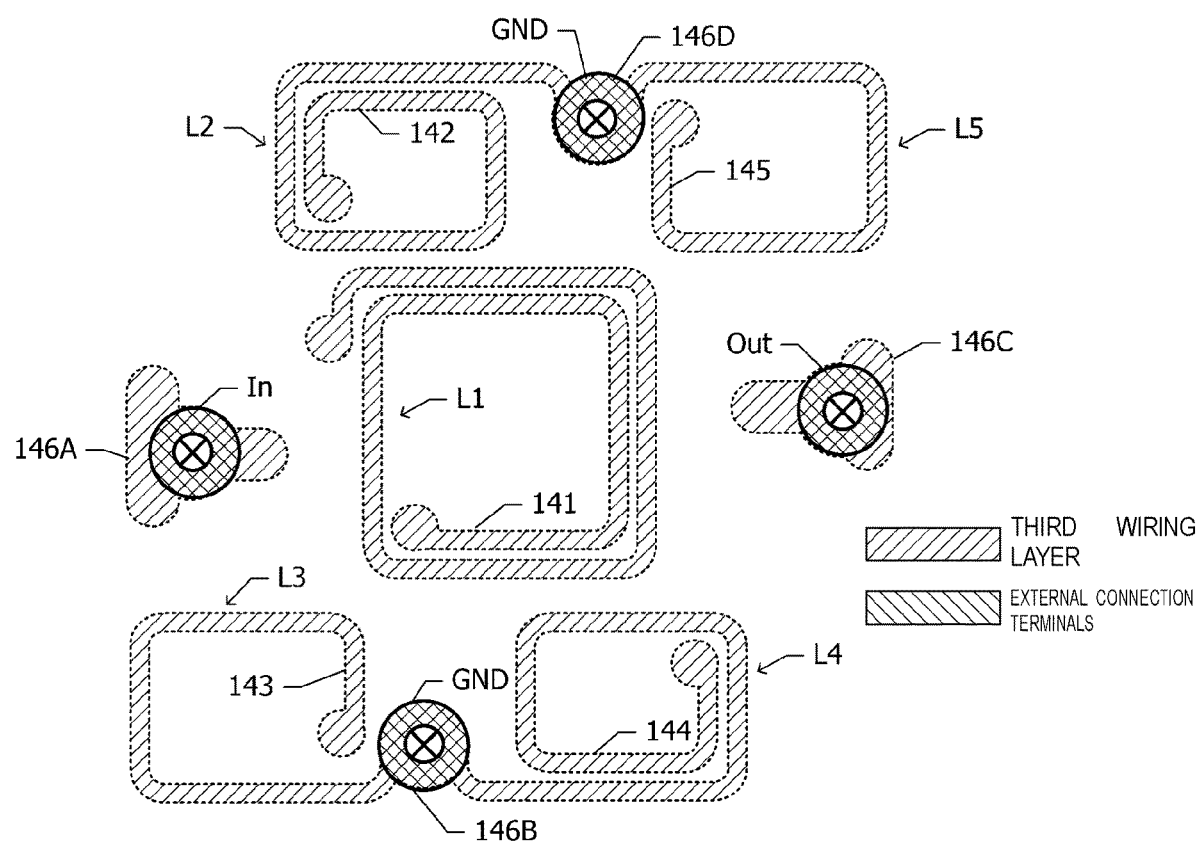
FIG. 11 illustrates the positional relationship between the conductor patterns in the third wiring layer and a plurality of external connection terminals in plan view.

FIG. 9A illustrates the positional relationship between conductor patterns in the lower electrode layer and conductor patterns in the upper electrode layer in plan view. FIG. 9B illustrates the positional relationship between the conductor patterns in the upper electrode layer and conductor patterns in the first wiring layer in plan view. FIG. 10A illustrates the positional relationship between the conductor patterns in the first wiring layer and conductor patterns in the second wiring layer in plan view. FIG. 10B illustrates the positional relationship between the conductor patterns in the second wiring layer and conductor patterns in the third wiring layer in plan view. FIG. 11 illustrates the positional relationship between the conductor patterns in the third wiring layer and the external connection terminals in plan view.

A lower electrode 101 (FIG. 9A) in the lower electrode layer and upper electrodes 111A and 111B (FIG. 9A) in the upper electrode layer form the capacitor C1. More specifically, a capacitor formed of the upper electrode 111A and the lower electrode 101 and a capacitor formed of the lower electrode 101 and the upper electrode 111B are connected in series to form the capacitor C1. Similarly, a lower electrode 102 (FIG. 9A) and upper electrodes 112A and 112B (FIG. 9A) form the capacitor C2. A lower electrode 104 (FIG. 9A) and upper electrodes 114A and 114B (FIG. 9A) form the capacitor C4. A lower electrode 106 (FIG. 9A) and upper electrodes 116A and 116B (FIG. 9A) form the capacitor C6.

A lower electrode 103 in the lower electrode layer and an upper electrode 113A in the upper electrode layer form the capacitor C3. A conductor pattern 113B in the upper electrode layer is connected to the lower electrode 103 through a via hole. Similarly, a lower electrode 105 and an upper electrode 115A form the capacitor C5. A conductor pattern 115B is connected to the lower electrode 105 through a via hole. Description of the via holes which each connect two conductor patterns, which are upper and lower conductor patterns, to each other will be omitted.

One upper electrode 111A (FIG. 9A) of the capacitor C1 is connected to the input terminal In (FIG. 11) through a conductor pattern 128A (FIG. 9B), a conductor pattern 136B (FIG. 10A), and a conductor pattern 146A (FIG. 10B). The other upper electrode 111B (FIG. 9A) of the capacitor C1 is connected to a conductor pattern 128B (FIG. 9B) and a conductor pattern 136D (FIG. 10A), and to a conductor pattern 141 (FIG. 10B), a conductor pattern 131 (FIG. 10A), and a conductor pattern 121 (FIG. 9B) of the inductor L1. The conductor pattern 121 (FIG. 9B) of the inductor L1 is connected to one upper electrode 112A (FIG. 9A) of the capacitor C2. The other upper electrode 112B (FIG. 9A) of the capacitor C2 is connected to the output terminal Out (FIG. 11) through a conductor pattern 126 (FIG. 9B), a conductor pattern 136F (FIG. 10A), and a conductor pattern 146C (FIG. 10B).

The upper electrode 113A (FIG. 9A) of the capacitor C3 is connected to the input terminal In (FIG. 11) through a conductor pattern 123 (FIG. 9B), a conductor pattern 136A (FIG. 10A), and the conductor pattern 146A (FIG. 10B). The lower electrode 103 (FIG. 9A) of the capacitor C3 is connected to a conductor pattern 146D (FIG. 10B) through the conductor pattern 113B (FIG. 9A) and through a conductor pattern 122 (FIG. 9B), a conductor pattern 132 (FIG. 10A), and a conductor pattern 142 (FIG. 10B) of the inductor L2. The conductor pattern 146D (FIG. 10B) is connected to the ground terminal GND (FIG. 11).

One upper electrode 114A (FIG. 9A) of the capacitor C4 is connected to the input terminal In (FIG. 11) through a conductor pattern 125A (FIG. 9B), a conductor pattern 136C (FIG. 10A), and the conductor pattern 146A (FIG. 10B). The other upper electrode 114B (FIG. 9A) of the capacitor C4 is connected to the ground terminal GND (FIG. 11) through a conductor pattern 125B (FIG. 9B), a conductor pattern 133 (FIG. 10A) and a conductor pattern 143 (FIG. 10B) of the inductor L3, and a conductor pattern 146B (FIG. 10B).

The upper electrode 115A (FIG. 9A) of the capacitor C5 is connected to the output terminal Out (FIG. 11) through a conductor pattern 129 (FIG. 9B), a conductor pattern 136G (FIG. 10A), and the conductor pattern 146C (FIG. 10B). The lower electrode 105 (FIG. 9A) of the capacitor C5 is connected to the ground terminal GND (FIG. 11) through the conductor pattern 115B (FIG. 9A), a conductor pattern 124 (FIG. 9B), a conductor pattern 134 (FIG. 10A), and a conductor pattern 144 (FIG. 10B) of the inductor L4, and the conductor pattern 146B (FIG. 10B).

One upper electrode 116B (FIG. 9A) of the capacitor C6 is connected to the output terminal Out (FIG. 11) through a conductor pattern 127B (FIG. 9B), a conductor pattern 136E (FIG. 10A), and the conductor pattern 146C (FIG. 10B). The other upper electrode 116A (FIG. 9A) of the capacitor C6 is connected to the ground terminal GND (FIG. 11) through a conductor pattern 127A (FIG. 9B), a conductor pattern 135 (FIG. 10A) and a conductor pattern 145 (FIG. 10B) of the inductor L5, and the conductor pattern 146D (FIG. 10B).

The multilayer structure of the integrated passive component according to the second embodiment is the same as that of the multilayer structure from the substrate 61 to the second insulating film 73 of the third layer according to the first embodiment illustrated in FIG. 4. The external connection terminals, such as the input terminal In, are arranged on the second insulating film 73 of the third layer.

Advantageous effects of the second embodiment will now be described. The integrated passive component according to the second embodiment has a multilayer structure similar to that of the integrated passive component (FIG. 4) according to the first embodiment. Therefore, similar to the first embodiment, formation of cracks due to thermal stress does not easily occur. Accordingly, reduction in the moisture resistance due to cracks can be suppressed, and the quality of the integrated passive component can be increased.

In addition, when a plurality of capacitors and a plurality of inductors are arranged on a single substrate 61 as in the second embodiment, the design flexibility of the passive circuit can be increased.

Third Embodiment

An integrated passive component according to a third embodiment will now be described with reference to FIG. 12. Description of structures that are the same as those of the integrated passive component according to the first embodiment illustrated in FIGS. 1A to 7 will be omitted.

Figure 12:
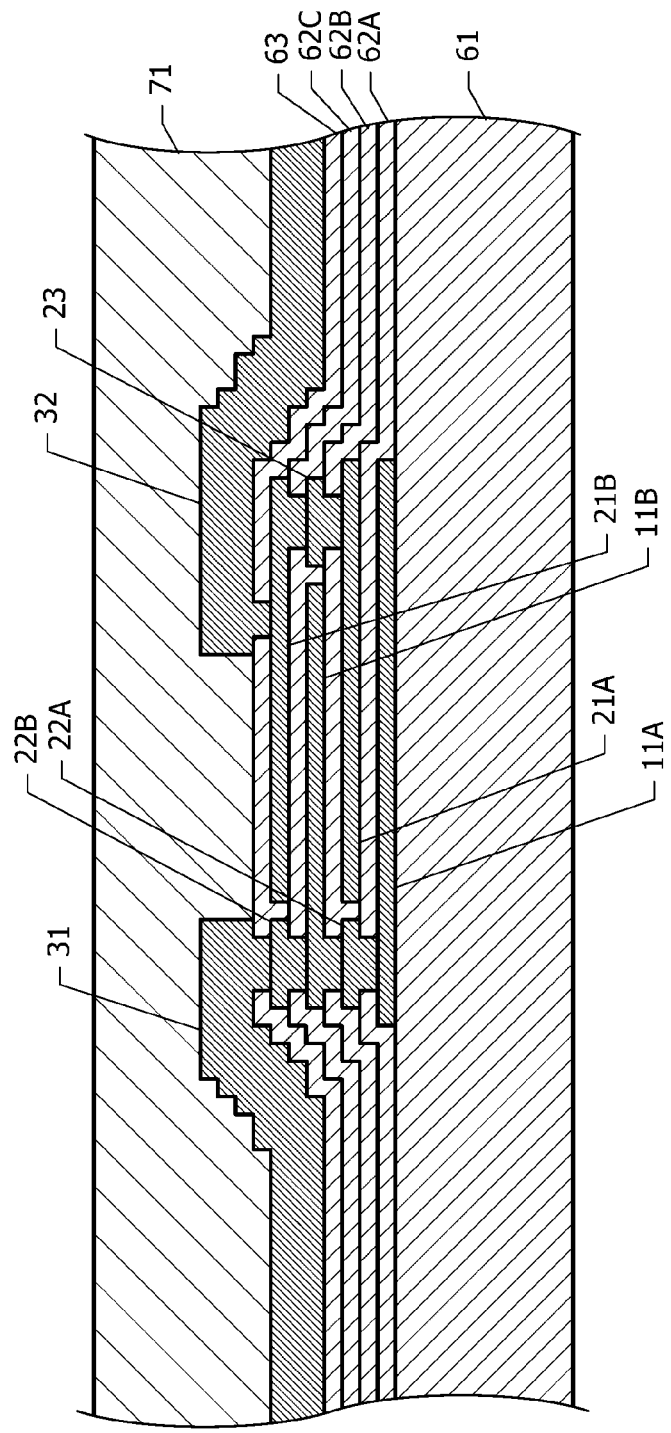
FIG. 12 is a sectional view of a capacitor portion of an integrated passive component according to a third embodiment.

FIG. 12 is a sectional view of a capacitor portion of the integrated passive component according to the third embodiment. FIG. 12 does not illustrate the structure above the second insulating film 71 of the first layer.

In the first embodiment, the capacitor C is formed of electrodes disposed in two layers, that is, the lower electrode 11 and the upper electrode 21 (FIG. 4). In the third embodiment, the capacitor C is formed of electrodes disposed in four layers. A first electrode 11A, a second electrode 21A, a third electrode 11B, and a fourth electrode 21B are laminated in that order from the substrate 61. A first dielectric film 62A is disposed between the first electrode 11A and the second electrode 21A, a second dielectric film 62B is disposed between the second electrode 21A and the third electrode 11B, and a third dielectric film 62C is disposed between the third electrode 11B and the fourth electrode 21B. Similar to the first embodiment, the capacitor C is covered by the first insulating film 63.

The dielectric films 62A, 62B, and 62C are made of an insulating material that mainly contains the same constituent element as the constituent element mainly contained in the substrate 61.

The first electrode 11A and the third electrode 11B are connected to each other through a conductor pattern 22A disposed in the same layer as the second electrode 21A. The second electrode 21A and the fourth electrode 21B are connected to each other through a conductor pattern 23 disposed in the same layer as the third electrode 11B. The third electrode 11B is connected to the conductor pattern 31, which constitutes a portion of an inductor, through a conductor pattern 22B disposed in the same layer as the fourth electrode 21B. The fourth electrode 21B is connected to the conductor pattern 32 disposed on the first insulating film 63.

Advantageous effects of the third embodiment will now be described.

In the third embodiment, the dielectric films 62A, 62B, and 62C are made of an insulating material that mainly contains the same constituent element as the constituent element mainly contained in the substrate 61. Therefore, thermal stress generated in the dielectric films 62A, 62B, and 62C due to the difference in coefficient of linear expansion can be reduced. As the number of layers of the electrodes of the capacitor C increases, cracks are more easily formed due to the thermal stress. However, according to the third embodiment, the thermal stress is reduced, so that the advantageous effect that formation of cracks can be reduced is obtained even when the number of layers of the electrodes is increased.

In addition, assuming that the capacitance of the capacitor C is constant, the area of the region occupied by the capacitor C in plan view can be reduced by increasing the number of layers of the electrodes of the capacitor C. Accordingly, the size of the integrated passive component can be reduced.

A modification of the third embodiment will now be described.

Although the capacitor C is formed of the electrodes in four layers in the third embodiment, the capacitor C may instead be formed of electrodes in three or five or more layers.

Fourth Embodiment

An integrated passive component according to a fourth embodiment will now be described with reference to FIG. 13. Description of structures that are the same as those of the integrated passive component according to the first embodiment illustrated in FIGS. 1A to 7 will be omitted.

Figure 13:
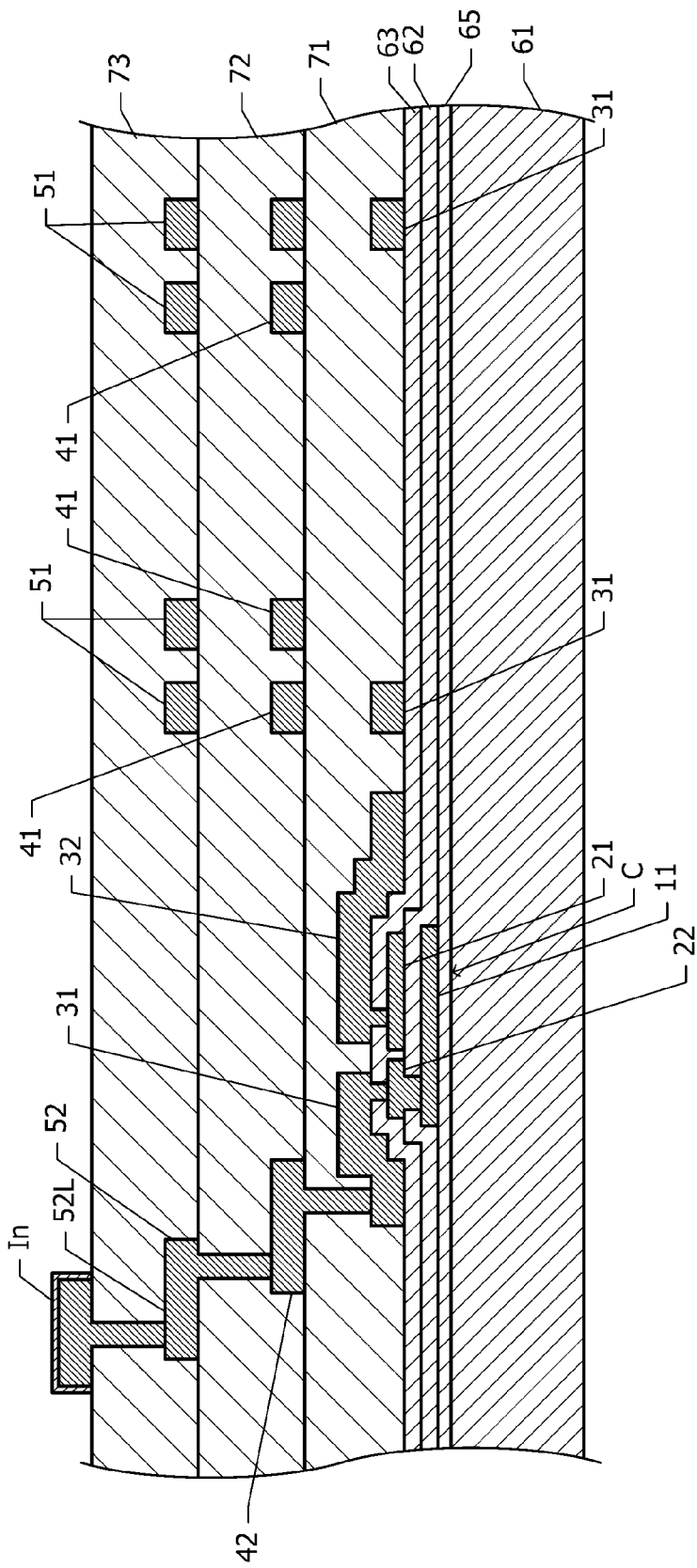
FIG. 13 is a sectional view of an integrated passive component according to a fourth embodiment.

FIG. 13 is a sectional view of the integrated passive component according to the fourth embodiment. In the first embodiment, the lower electrode 11 is disposed directly on the substrate 61. In the fourth embodiment, an underlayer 65 is disposed on the upper surface of the substrate 61, and the lower electrode 11 is disposed on the underlayer 65. The dielectric film 62 is also disposed on the underlayer 65.

The underlayer 65, which is made of an insulating material that mainly contains the same constituent element as the constituent element mainly contained in the substrate 61. For example, the underlayer 65 is made of the same insulating material as that of the dielectric film 62. The underlayer 65 is thinner than the substrate 61. The underlayer 65 may be formed on the substrate 61 by, for example, plasma CVD.

The underlayer 65, which is formed by a thin-film formation technique, such as plasma CVD, has a surface roughness less than that of the upper surface of the ceramic substrate 61. The relationship between the magnitudes of the surface roughnesses may be determined based on, for example, arithmetical mean roughness or root mean square roughness.

Advantageous effects of the fourth embodiment will now be described.

In the fourth embodiment, the ground surface on which the lower electrode 11 is formed (upper surface of the underlayer 65) has a surface roughness less than that of the ground surface on which the lower electrode 11 is formed in the first embodiment (upper surface of the substrate 61). Accordingly, conductor patterns in the conductor layer in which the lower electrode 11 is disposed can be finely formed by photolithography. As a result, the size of the integrated passive component can be reduced.

The underlayer 65 is made of an insulating material that mainly contains the same constituent element as the constituent element mainly contained in the substrate 61, so that the difference in coefficient of linear expansion between the underlayer 65 and the substrate 61 is small Therefore, the advantageous effect of the first embodiment that formation of cracks due to thermal stress can be reduced is not cancelled by the underlayer 65.

Fifth Embodiment

An integrated passive component according to a fifth embodiment will now be described with reference to FIGS. 14A, 14B, and 14C. Description of structures that are the same as those of the integrated passive component according to the first embodiment illustrated in FIGS. 1A to 7 will be omitted.

FIG. 14A is a sectional view of the integrated passive component according to the fifth embodiment. FIGS. 14B and 14C are sectional views of the lower electrode 11 and the conductor pattern 41, respectively. In the fifth embodiment, a lower conductor layer 11L (FIG. 14B) is disposed on a lower surface of the lower electrode 11, and an upper conductor layer 11U (FIG. 14B) is disposed on an upper surface of the lower electrode 11. Similarly, the upper electrode 21 and the conductor pattern 22 each have a lower conductor layer and an upper conductor layer on a lower surface and an upper surface thereof. The lower conductor layer is also formed on the side surface of the via hole.

A lower conductor layer 41L and an upper conductor layer 41U (FIG. 14C) are respectively disposed on a lower surface and an upper surface of the conductor pattern 41 in the second wiring layer. Similarly, a lower conductor layer and an upper conductor layer are respectively disposed on a lower surface and an upper surface of each of the other conductor pattern 42 in the second wiring layer and the conductor patterns in first and third wiring layers. In addition, a lower conductor layer is formed on a lower surface of each of the external connection terminals, such as an input terminal In.

In FIG. 14A, the lower conductor layers and the upper conductor layers are shown by relatively bold solid lines. The lower conductor layers 11L and 41L, the upper conductor layers 11U and 41U, and other lower and upper conductor layers may be made of Ti, Ni, an alloy containing Ti, or an alloy containing Ni. The alloy containing Ti may be, for example, TiW. When the multilayer metal film 203 (FIG. 6B) used as a seed layer for electroplating is made of Ti, the seed layer made of Ti may be used as a lower conductor layer.

Advantageous effects of the fifth embodiment will now be described.

Since the lower conductor layer 11L (FIG. 14B) is provided, adhesion between the substrate 61 and the lower electrode 11 can be increased. Since the upper conductor layer 11U (FIG. 14B) is provided, adhesion between the lower electrode 11 and the dielectric film 62 can be increased. Since the lower conductor layer 41L (FIG. 14C) is provided, adhesion between the conductor pattern 41 and the second insulating film 71 of the first layer can be increased. Since the upper conductor layer 41U (FIG. 14C) is provided, adhesion between the conductor pattern 41 and the second insulating film 72 of the second layer can be increased. Similarly, adhesion between each of the other conductor patterns and an insulating film, a dielectric film, etc. disposed thereabove and therebelow can be increased.

Since the adhesion between the conductor patterns and the insulating films is increased, an integrated passive component of a higher quality can be provided.

A modification of the fifth embodiment will now be described.

To increase the adhesion between the conductor patterns made of Cu and the insulating films disposed thereon, the copper surfaces may be subjected to a roughening treatment (CZ treatment).

The above-described embodiments are merely examples, and structures described in different embodiments may, of course, be partially replaced or combined. Similar effects obtained by similar structures of different embodiments are not described in each embodiment. The present disclosure is not limited to the above-described embodiments. For example, it is obvious to those skilled in the art that various alterations, improvements, combinations, etc., are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An integrated passive component comprising:
a substrate that is insulative;
a capacitor disposed on the substrate, the capacitor including
a dielectric film that mainly contains a same constituent element as a constituent element mainly contained in the substrate, and
at least two electrodes that face each other with the dielectric film interposed therebetween; and
an inductor disposed on the substrate, the inductor including a conductor pattern having at least one end connected to the capacitor,
wherein the substrate and the dielectric film mainly contain silicon and nitrogen as constituent elements.

2. The integrated passive component according to claim 1, further comprising:
a first insulating film that covers the capacitor and that mainly contains a same constituent element as the constituent element mainly contained in the dielectric film,
wherein the inductor is disposed above the first insulating film.

3. The integrated passive component according to claim 1, wherein
the inductor has a helical structure or a spiral structure having a central axis extending in a direction perpendicular to a surface of the substrate on which the capacitor is disposed, and
the inductor is located to avoid overlapping the capacitor in plan view.

4. The integrated passive component according to claim 1, wherein
the at least two electrodes of the capacitor comprise electrodes in at least three layers that are laminated, and the dielectric film is disposed between each pair of the electrodes that vertically face each other.

5. The integrated passive component according to claim 1, wherein
the substrate is made of a ceramic,
the integrated passive component further comprises an underlayer that is amorphous and insulative, the underlayer being disposed on the substrate and mainly containing the same constituent element as the constituent element mainly contained in the substrate, and
the capacitor is disposed on the underlayer.

6. The integrated passive component according to claim 1, wherein
the electrodes of the capacitor are made of Au, Al, or Cu.

7. The integrated passive component according to claim 6, wherein
the capacitor further includes a conductor layer disposed between the dielectric film and each of the electrodes of the capacitor and on a lower surface of a lowermost one of the electrodes of the capacitor, the conductor layer being made of Ti, Ni, an alloy containing Ti, or an alloy containing Ni.

8. The integrated passive component according to claim 1, further comprising:
a plurality of second insulating films laminated on the substrate and the capacitor,
wherein the conductor pattern included in the inductor is disposed above and below at least one of the plurality of second insulating films.

9. The integrated passive component according to claim 8, wherein
the plurality of second insulating films each have a Young's modulus of less than or equal to 10 GPa.

10. The integrated passive component according to claim 8, wherein
the plurality of second insulating films are made of a resin.

11. The integrated passive component according to claim 8, wherein
the plurality of second insulating films each have an upper surface and a lower surface, the upper surface having a deviation from flatness less than a deviation from flatness of the lower surface.

12. The integrated passive component according to claim 8, wherein
the conductor pattern included in the inductor is made of Cu or a metal material containing Cu as a main component.

13. The integrated passive component according to claim 12, wherein
the inductor includes a conductor layer disposed at an interface between the conductor pattern included in the inductor and each of the plurality of second insulating films, the conductor layer being made of Ti, Ni, an alloy containing Ti, or an alloy containing Ni.

14. The integrated passive component according to claim 8, wherein
the conductor pattern included in the inductor has a thickness of greater than or equal to five times a thickness of each of the electrodes of the capacitor.

15. The integrated passive component according to claim 2, wherein
the inductor has a helical structure or a spiral structure having a central axis extending in a direction perpendicular to a surface of the substrate on which the capacitor is disposed, and
the inductor is located to avoid overlapping the capacitor in plan view.

16. The integrated passive component according to claim 2, wherein
the at least two electrodes of the capacitor comprise electrodes in at least three layers that are laminated, and
the dielectric film is disposed between each pair of the electrodes that vertically face each other.

17. The integrated passive component according to claim 2, wherein
the substrate is made of a ceramic,
the integrated passive component further comprises an underlayer that is amorphous and insulative, the underlayer being disposed on the substrate and mainly containing the same constituent element as the constituent element mainly contained in the substrate, and
the capacitor is disposed on the underlayer.

18. The integrated passive component according to claim 2, wherein
the electrodes of the capacitor are made of Au, Al, or Cu.

* * * * *